(12) United States Patent
Henrichs

(10) Patent No.: US 6,819,701 B2
(45) Date of Patent: Nov. 16, 2004

(54) SUPER-LUMINESCENT FOLDED CAVITY LIGHT EMITTING DIODE

(76) Inventor: Joseph Reid Henrichs, 641 NE. Swann Cir., Lee's Summit, MI (US) 64086-8464

( * ) Notice: Subject to any disclaimer, the term of this patent is extended or adjusted under 35 U.S.C. 154(b) by 0 days.

(21) Appl. No.: 10/106,725

(22) Filed: Mar. 26, 2002

(65) Prior Publication Data

US 2003/0185265 A1 Oct. 2, 2003

(51) Int. Cl.[7] .............................. H01S 3/08; H01S 3/081
(52) U.S. Cl. ............................................ 372/96; 372/93
(58) Field of Search .............................. 372/96, 93, 99, 372/43

(56) References Cited

U.S. PATENT DOCUMENTS

| | | | | |
|---|---|---|---|---|
| 4,099,141 A | * | 7/1978 | Leblanc et al. | ............ 372/93 |
| 4,634,928 A | | 1/1987 | Figueroa et al. | |
| 5,008,718 A | | 4/1991 | Fletcher et al. | |
| 5,048,035 A | | 9/1991 | Sugawara et al. | |
| 5,117,433 A | * | 5/1992 | Tatsuno et al. | ............ 372/22 |
| 5,359,209 A | | 10/1994 | Huang | |
| 5,481,122 A | | 1/1996 | Jou et al. | |
| 5,548,610 A | * | 8/1996 | Bouadma et al. | ............ 372/99 |
| 5,568,499 A | * | 10/1996 | Lear | ............ 372/45 |
| 5,832,017 A | * | 11/1998 | Ramdani et al. | ............ 372/45 |
| 5,903,586 A | * | 5/1999 | Ramdani et al. | ............ 372/45 |
| 5,963,574 A | * | 10/1999 | Gregor et al. | ............ 372/75 |
| 6,081,542 A | * | 6/2000 | Scaggs | ............ 372/70 |
| 6,327,280 B1 | * | 12/2001 | Ducellier et al. | ............ 372/20 |
| 6,331,910 B1 | * | 12/2001 | Dultz et al. | ............ 359/246 |
| 6,424,669 B1 | * | 7/2002 | Jiang et al. | ............ 372/50 |
| 6,625,195 B1 | * | 9/2003 | Henrichs | ............ 372/96 |

OTHER PUBLICATIONS

Huang et al., "Twofold efficiency improvement in high performance AiGaInP light–emitting diodes in the 555–620 nm spectral region using a thick GaP window layer," *Appl. Phys. Lett.*, 61(9), Aug. 31, 1992, pp. 1045–1047.

Scifres et al., "GaAs/GaAIAs Diode Lasers with Angled Pumping Stripes," *IEEE Journal of Quantum Electronics*, vol. QE–14, No. 4, Apr. 1978.

* cited by examiner

Primary Examiner—Don Wong
Assistant Examiner—Hung Tran Vy
(74) Attorney, Agent, or Firm—Kirkpatrick & Lockhart LLP

(57) ABSTRACT

Super-luminescent (FCLED) "Folded Cavity Light Emitting Diode" comprising a cavity folding waveguide (34) that has at least one total internal reflecting prism (34 A), which provides for a redirection of intra-cavity produced fundamental photonic radiation (40 A) from a longitudinal propagation (40 B) into a transverse propagation (40° C.), and back into a longitudinal (40 E) yet reversed propagation (40° F.) defining a folded cavity, an active-region (36) that comprises an active-area (36 B) defining spontaneous-emission of photonic radiation, and a photon collimating window emitter-layer (38), which is capable of collimating and focusing sufficient undiffused optical radiation into a propagation direction away from the present invention's optically folded vertical cavity.

12 Claims, 19 Drawing Sheets

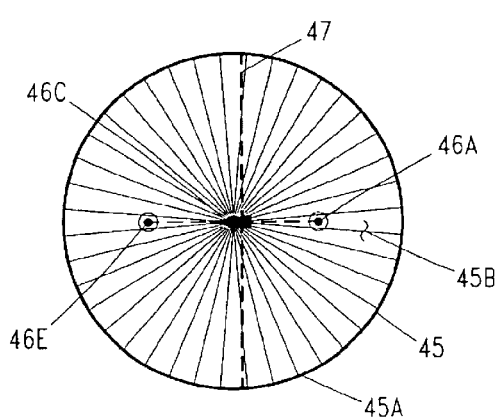
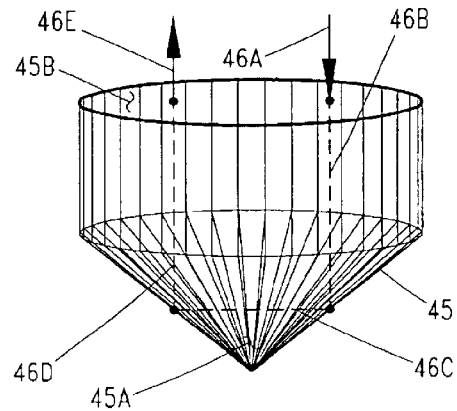
*FIG.20A*  *FIG.20B*
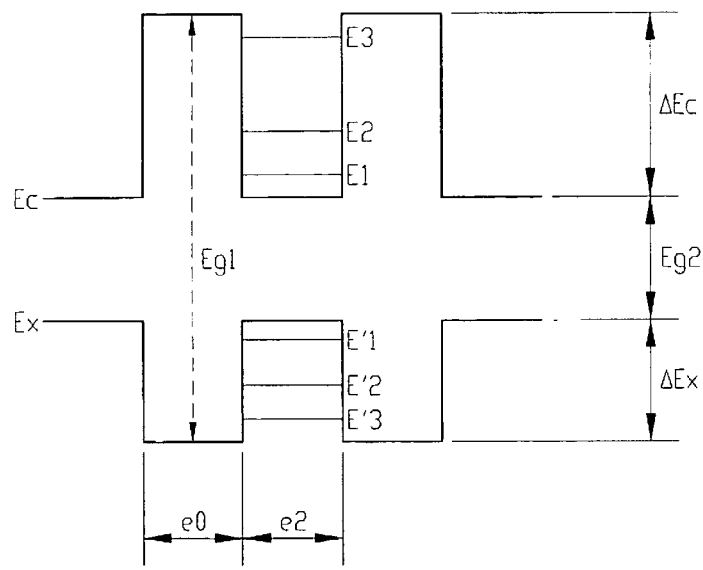
*FIG.21*

SUPER-LUMINESCENT FOLDED CAVITY LIGHT EMITTING DIODE

CROSS-REFERENCE TO RELATED APPLICATIONS

This patent application uses, as the preferred embodiment of the polyhedral prism waveguide, the corner-cube prism mirror of my co-pending Non-provisional Patent Application Ser. No. 09/357,685, which was filed in the U.S. Patent and Trademark Office Jul. 20, 1999.

This patent application uses, as the preferred embodiment of the polyhedral prism waveguide, the corner-cube prism waveguide of my co-pending Nonprovisional Patent Application Ser. No. 09/765,554, which was filed in the U.S. Patent and Trademark Office Jan. 19, 2000.

This patent application uses, as the preferred embodiment of the polyhedral prism waveguide, the corner-cube prism waveguide of my co-pending Nonprovisional Patent Application Ser. No. 09/621,888, which was filed in the U.S. Patent and Trademark Office Jul. 22, 2000.

FEDERALLY SPONSORED RESEARCH OR DEVELOPMENT

Not Available

REFERENCE TO MICROFICHE APPENDIX

Not Available

TECHNICAL FIELD OF INVENTION

This invention relates to light-emitting devices, or more specifically to a class of semiconductor light emitting diodes known as super-luminescent light emitting diodes, which are constructed as multilayered structures having vertical cavities that, on the minimum, comprise a substrate base, a light reflecting mirror structure, which is typically a quarterwave mirror stack assembly, a double-heterostructure (LED) "Light Emitting Diode", and a window emitter-layer.

BACKGROUND OF THE INVENTION

Side-emitting "Light Emitting Diodes" (LEDs) are well known semiconductor light emitting devices in which, electrical current (i.e., electrical pumping) is made to pass through a diode junction to produce light emissions within an active layer of semiconductor material, which is located within the p-n junction of the previously mentioned diode itself. At least one facet of a side-emitting LED device is coated with an anti-reflective material, which will cause light emissions to exit the coated facet. This is to be contrasted with a side-emitting light emitting diode laser, where stimulated emission of light is also made to occur within the light emitting diode's junction. Stimulated emission occurs when the electrically pumped fundamental light already created within the light emitting diode's double-heterojunction is made to optically stimulate the double-heterojunction's active semiconductor layer or layers, which are also normally located between the side emitting diode's two contra-opposed light reflecting crystal facets.

Wherein, repeated reflections of light are made to oscillate through the diode junction's active semiconductor layer or layers, back and forth, between the diode's previously mentioned contra-opposed light reflecting crystal facets, causing a coherent laser beam to emerge. The resulting laser beam usually has a very narrow spectral width (i.e., meaning monochromatic). Non-laser light emitting diodes that operate at a relatively higher power over other LEDs, while having a relatively broad spectral width are within a third category of devices called super-luminescent light-emitting diodes. There is a need for these devices, when they are used in fiber optic systems having a requirement for low Raleigh backscattering, such as in fiber optic gyroscopes or devices needing low modal noise. Commercially available super-luminescent light-emitting diodes typically emit light at powers as high as "4" to "6" mW (i.e., milliwatts).

However, when the power in these devices is increased above "1" to "2" mW, the frequency spectrum is substantially narrowed. Driving devices with contra-positioned edge-emitting facets to higher powers may eventually cause lasing, in spite of the presence of the anti-reflective coating on the previously mentioned facets, since even the best anti-reflective coating will reflect some proportion of the light impinging on it, and lasing will eventually occur if the power is increased to a high enough level. The lasing threshold for pulsed diode operation increases with decreased facet reflectivity. The only successful high-power anti-reflective coated super-luminescent diodes were made by dynamically monitoring the pulsed laser threshold during the coating process. For this reason, the anti-reflective coatings in super-luminescent light-emitting diodes have to be carefully controlled to permit operation at higher power levels. When a super-luminescent diode having one or both facets coated with an anti-reflective material is operated at a high enough current, the spectral content of the output light may still cover a desirably broad band of wavelengths.

However, above a certain power level the device operates more and more like a laser and its output spectrum is characterized by narrow modal lines spread over a relatively broad band. In this lasing mode of operation, the device is said to operate with a high degree of Fabry-Perot modulation, the characteristic laser-cavity modulation that is undesirable for applications like the fiber optic gyroscope. These applications require very low Raleigh back-scattering noise, which can only be obtained with a low coherence length and a wide spectral width. As the power of a side-emitting super-luminescent light emitting diode is increased and its spectral width is consequently decreased, the coherence length of light from the device is increased. The coherence length is another measure of the spectral purity of light, and is inversely proportional to spectral width. As the spectral width becomes narrower, the coherence length increases.

Moreover, if the edge-emitting device operates with a large degree of Fabry-Perot modulation and moves into a lasing mode, the coherence length is inversely proportional to the spectral width of the individual modal-lines within the intensity-wavelength characteristics of the device. Thus, the coherence length for the lasing mode of operation is several orders of magnitude larger than the coherence length for a super-luminescent diode. The requirement for a light-emitting device with low coherence length and relatively high power is simply not attainable with presently available super-luminescent diodes using antireflective coatings to suppress lasing. The cross-referenced U.S. Pat. No. 4,634,928 proposes one technique for the suppression of lasing in a light-emitting device. That approach employs means within the semiconductor structure for producing a non-uniform gain profile along the active layer of the device. The non-uniformity of the gain profile results in a broadening of the frequency spectrum of emitted light. As the power is increased, the spectral width increases even more, permitting the output of relatively high powers while maintaining a broad spectral width.

Some years ago, D. R. Scifres et al. reported in the IEEE Journal of Quantum Electronics, QE-14, 223 (1978), that he experimented with a different type of structure that showed promise as a super-luminescent diode. Conventionally, a side-emitting semiconductor laser is constructed to laze in a direction normal to the crystalline cleavage plane along which the facets are formed. These researchers constructed a laser at an angle inclined to the normal direction, such that light propagating at an internal angle of zero, i.e. parallel to the longitudinal direction of the laser, would impinge on the facets at a small angle to the perpendicular. The Scifres et al. cavity structure was of the "gain-guided" type of optical cavity.

Moreover, all light-emitting semiconductors emit light from a diode junction to which power is supplied electrically from a contact stripe formed on the device. If a narrow electrical contact is employed to supply the current, lasing action is typically limited to a correspondingly narrow region, with the lateral waveguide boundary defined by the gain profile, i.e. with no intentional refractive index profile built into the structure. This process is generally referred to as gain guiding. The Scifres et al. side-emitting device was run in a pulsed mode and, although super-luminescence was observed, a large proportion of the output was due to lasing.

Moreover, there was an observed tendency at higher currents for the internal beam angle to move toward zero, which minimizes reflectivity losses at the facets and pushes the device more strongly into lasing operation. It will be appreciated from the foregoing that there is still a need for a super-luminescent diode with the characteristics of high power, large spectral width, and low Fabry-Perot modulation. Specifically, the requirement is for a device operable at powers more than "10" mW (i.e., milliwatts), a spectral half-width of at least "50" angstroms, and at most 10% Fabry-Perot modulation. The present invention meets or exceeds these requirements without difficulty. The present invention has a redefined Fabry-Perot modulation neutralizing vertical folded cavity design. Inspired by the present invention's unique Fabry-Perot modulation neutralizing folded cavity and by the optical physics that occur therein, for future identification, the present invention has been named the "Folded Cavity Light Emitting Diode" (FCLED).

In addition, vertical cavity surface emitting diodes have employed "Aluminum-Gallium-Indium-Phosphide" (AlGaInP) alloy technology for making "Light Emitting Diodes" (LEDs) of wavelengths ranging from about "550" to "680" nanometers by adjusting the aluminum to gallium ratio in the active region of the previously mentioned LEDs. Further, "Metalorganic Vapor Phase Epitaxy" (MOVPE) is used to grow efficient AlGaInP heterostructure devices. While, a conventional LED contains a double heterostructure of AlGaInP, which includes an n-type AlGaInP cladding-layer formed on an n-type substrate of "Gallium-Arsenide" (GaAs), an active layer of AlGaInP formed on the n-type cladding-layer, and a p-type AlGaInP cladding layer formed on the active layer.

Furthermore, for efficient operation of the previously mentioned LED, injected current should be spread evenly in the lateral direction of the device, so that the current will cross the p-n junction of the double heterostructure of AlGaInP uniformly to generate light evenly. The p-type AlGaInP cladding-layer, which is grown by MOVPE process, is very difficult to dope with acceptors of a concentration higher than 1 E18 cm.sup.-3. Further, hole mobility (i.e., about 10 to 20 cm.sup.2 *v/sec) is low in p-type AlGaInP semiconductors. Due to these factors, the electrical resistivity of the p-type AlGaInP layer is comparatively high (i.e., about 0.3–0.6 .OMEGA.-cm normally), so that current spreading is severely restricted.

Consequently, current tends to concentrate, and is often referred to as the current crowding problem. One technique to solve the current crowding problem is disclosed by Fletcher et. al. in U.S. Pat. No. 5,008,718. The structure of the proposed LED is fabricated with a back electrical contact, a substrate of n-type GaAs, a double heterostructure of AlGaInP, a window-layer of p-type GaP, and a front electrical contact. The double heterostructure of AlGaInP mentioned above includes a bottom-cladding layer of n-type AlGaInP, an active layer of AlGaInP, and a top cladding layer of p-type AlGaInP. The window-layer should be selected from materials that have a low electrical resistivity so that current can spread out quickly, and have a band gap higher than that of the AlGaInP layers so that the window-layer is transparent to light emitted from the active layer of AlGaInP.

In addition, an LED for generating light in the spectrum from red to orange, AlGaAs material is selected to form the window-layer. The AlGaAs material has the advantage of having a lattice constant compatible with that of the underlying GaAs substrate. In an LED for generating light in the spectrum from yellow to green, GaAsP or GaP material is used to form the window-layer. It is a drawback of using the GaAsP or the GaP material that their lattice constants are not compatible with those of the AlGaInP layers and the GaAs substrate. This lattice-mismatch causes a high dislocation density that produces less than satisfactory optical performance. In Applied Physics Letter, vol 61 (1992), p. 1045, K. H. Huang et. al. discloses a similar structure having a thick layer of about 50.mu.m (i.e., or 500000 angstroms) in thickness. This structure provides a three times luminance efficiency than an LED without a window-layer, and two-times luminance efficiency than an LED with a window-layer of about 10 .mu.m in thickness.

Moreover, the fabrication of this structure unfavorably requires two different processes of "Metalorganic Vapor Phase Epitaxy" (MOVPE) for growing the double heterostructure of AlGaInP, and "Vapor Phase Epitaxy" (VPE) for forming the thick window-layer of GaP; thereby, increasing manufacturing time and complexity. Another prior art super-luminescent LED design, which is disclosed in U.S. Pat. No. 5,048,035 is described as being fabricated with a current-blocking layer of AlGaInP on a portion of the double heterostructure, and a contact layer of GaAs located between the window-layer and the electrode. The current-blocking layer is arranged at a position where it is in alignment with the front electrode and thus current is spread out laterally by the current-blocking layer.

Moreover, two MOVPE processes are disadvantageously required in fabricating this structure, i.e. forming the heterostructure and the current-blocking layer by a first MOVPE, followed by a photolithography technique to define the area of the current-blocking layer, and forming the window-layer by a second MOVPE. Another prior art super-luminescent LED as disclosed in U.S. Pat. No. 5,359,209 is described as being fabricated with an additional p-type window-layer of GaAs located between the heterostructure and the p-type window-layer of GaP. Although the window-layer of GaAs has good conductivity with carrier concentration of 10.sup.19 cm.sup.-3 or more, the structure induces a light absorption phenomenon because the energy gap of GaAs is substantially less than that of AlGaInP in the active layer. In addition, another prior art super-luminescent LED design, as disclosed in U.S. Pat. No. 5,481,122 describes the previously mentioned window-layer of "Gallium- Phosphide" (GaP) as being replaced by a p-type contact-layer and a conductive transparent oxide-layer. Moreover, "Indium Tin Oxide" (ITO) is preferably used for forming the previously mentioned conductive transparent oxide layer, which has a high transparency rate of about 90% in the range of visible light. Further, its electrical resistivity (i.e., about 3.times.10.sup.-4 .OMEGA.-cm) is about "1000" times smaller than that of p-type AlGaInP, and about "100" times smaller than that of p-type GaP. However, the optimal thickness of about "1000" to about "50000" angstroms does not provide a good condition for effectively emitting light, thereby confining the luminance efficiency of the LED.

In addition, prior art as illustrated in FIGS. 1, 2, 3, and 4 describes super-luminescent "Light Emitting Diodes" (LEDs) as having, first of all, a back electrical contact 13, which is provided to act as a back electrode. Typically, prior art, as illustrated in FIGS. 1, 2, 3, and 4 describes a back electrical contact 13 as being made from a material that provides an n-type electrode. However, it must also be appreciated that a p-type electrode 13 can be used instead of the previously mentioned n-type electrode 13 without departing from the scope of the claimed invention. A substrate 14 layer is then formed on the n-type electrode 13.

Moreover, prior art as illustrated in FIGS. 1, 2, 3, and 4 describes the previously mentioned substrate layer 14 as being constructed from a n-type "Gallium-Arsenide" (GaAs) binary semiconductor material, which is conventionally formed to a thickness of about 350.mu.m onto the outermost surface of the previously mentioned n-type electrode layer 13, using a known growth method. A layer stacked double-heterojunction structure of "Aluminum-Gallium-Indium-Phosphide" (AlGaInP) 17 is often referred to as active p-n junction layer, and is often formed on the substrate 14 of GaAs. Prior art as illustrated in FIGS. 1, 2, 3, and 4 shows that the previously mentioned multi-stacked structure 17 includes a bottom n-type cladding-layer of "Aluminum-Gallium-Indium-Phosphide" (AlGaInP) 17A, an active-area layer of AlGaInP 17B (i.e., typically un-doped), and a top p-type cladding-layer of AlGaInP 17C. The thickness of the bottom cladding-layer 17A, the active-area layer 17B, and the top cladding-layer 17C is preferably about 1.0, 0.75, and 1.0.mu.m respectively.

Moreover, in one implementation of prior art the active-area layer 17B is formed using a conventional "Double Heterostructure" (DH) technique. In another implementation of prior art an active-area layer 17B can also be formed using another yet conventional structure typically called a multiple quantum well (MQW). A MQW, owing to quantum effect, will decrease the proportion of "Aluminum" (Al) located within the previously mentioned active layer 17B; effectively reducing the proportion of oxygen located therein. Consequently, the quality of the crystalline is improved, and the illuminance efficiency of the prior-art super-luminescent LED is increased accordingly. Further, carrier overflow phenomenon is also reduced, confining carriers inside the quantum wells, because the carrier concentration in each quantum well is reduced as the number of the quantum wells becomes large.

Moreover, there are generally two types of multiple quantum well structures that might be used by prior art:
  (i) A step index separate confinement MQW, in which there are step-shaped confining layers (i.e., not shown) located between the cladding-layers 17A, 17C, and the MQW active-area layer 17B.
  (ii) A graded index separate confinement MQW, which uses graded confining-layers within the cladding-layers 17A, 17C, and the MQW active-area layer 17B. However, for a shorter wavelength (i.e., about 575-nm to 560-nm) LED structure having a weaker quantum well confinement, the previously mentioned graded index separate confinement MQW will achieve a better illuminance efficiency since it contains a reduced density of states in the previously mentioned confining-layers.

Moreover, prior art as illustrated in FIGS. 1, 2, 3, and 4 also describes a p-type window-layer 18 with a thickness of about 10.mu.m as being formed on the top cladding-layer 17C. Where, the electrical resistivity of the previously mentioned window-layer 18 (i.e., about 0.05.OMEGA.-cm) is less than or equal to that of the top cladding-layer 17C. A transparent material, such as "Gallium-Phosphide" (GaP), "Gallium-Arsenide-Phosphide" (GaAsP), "Gallium-Indium-Phosphide" (GaInP), or "Aluminum-Gallium-Arsenide" (AlGaAs) is preferably used. This window-layer 18 is typically used to improve the illuminance efficiency of super-luminescent LEDs. For example, a conventional 590-nm LED without a window-layer usually has a brightness of fifteen "Minicandela" (MCD). However, 30-mcds or more can be obtained by adding the previously mentioned window-layer 18 (FIGS. 1, 2, 3, and 4) onto the outermost surface of the previously mentioned top cladding-layer 17C. Prior art also shows that the window-layer 18 can also be formed as a compositional graded window-layer by gradually adjusting the composition of AlGaInP material within the window-layer's structure.

In addition, prior art as illustrated in FIGS. 1, 2, 3, and 4 describes a staircase formation of the previously mentioned window-layer 18 (FIG. 3), where the proportion of Ga, In, or Al is changed stepwise along with the thickness of the window-layer 18 itself. Prior art, as illustrated in FIGS. 1, 2, 3, and 4 shows another similar situation, where the proportion of Ga, In, or Al is changed linearly. Similarly, prior art also describes a sub linear formation, and a super linear formation. Wherein, the staircase and the linear formation of the window-layer have the advantage of high controllability and stability, where the sub linear formation has the advantage of a thicker window-layer because of its low defect density, while the super linear formation can be used to increase illuminance efficiency by lowering resistivity of the previously mentioned window-layer 18. More generally, use of a compositional graded window-layer 18 makes the window-layer's lattice-constant compatible with that of the underlying double-heterostructure diode layer 17.

In addition, prior art also describes the use of a p-type contact-layer 19 that is directly formed on the window-layer 18 using a GaAsP, GaP, GaInP, or GaAs semiconductor material. Prior art, also describes the carrier concentration within the previously mentioned contact-layer 19 as being greater than 5.times.10.sup.18 cm.sup.-3, and its thickness as being no greater than 500 angstroms, so that a good ohmic contact can be formed between the window-layer 18 and a conductive transparent oxide-layer 20. Where, the electrical resistivity of the conductive transparent oxide-layer 20 (i.e., about 3.times.10.sup.-4 .OMEGA.-cm) is smaller than that of the contact-layer (i.e., about 0.01 .OMEGA.-cm) and the window-layer 18 (i.e., about 0.05 .OMEGA.-cm).

Moreover, "Tin Oxide" (TO), "Indium Oxide" (IO), or "Indium Tin Oxide" (ITO) is preferably used to form the previously mentioned conductive transparent oxide-layer 20. The preferred thickness of the conductive transparent oxide-layer 20 is between "1000" to "50000" angstroms. Therefore, the transmittance of the conductive transparent oxide-layer 20 is excellent for LEDs in the wavelength range of from 550-nanometers (i.e., green) to 630-nanometers (i.e., red). The conductive transparent oxide-layer 20 does not absorb photons emitted from the active-region 17, and its electrical resistivity is only about $3.times.10.sup.-4$ .OMEGA.-cm, preferably, so that the injected current may substantially spread out through the entire diode, thereby contributing to higher power output.

Moreover, the window-layer 18 is not thick enough to provide good spreading capability for overcoming the current crowding problem, therefore the window-layer 18 and the conductive transparent oxide-layer 20 work together to provide prior nit super-luminescent LEDs with high-brightness. Prior art as illustrated in FIGS. 1, 2, 3, and 4 shows that 50-mcd or more can be obtained, compared to 15-mcd for a conventional LED, without the window-layer 18 and the conductive transparent oxide-layer 20. Finally, a p-type electrical contact 21 is typically formed on a portion of the conductive transparent oxide-layer 20 to act as a front electrode. It is noted that each layer, except the previously mentioned conductive transparent oxide-layer 20 and the electrodes 13, 21 (FIGS. 1, 2, 3, and 4) can be grown using a "Metalorganio Vapor Phase Epitaxy" (MOVPE) method, thereby achieving high controllability of composition, carrier concentration, layer thickness, and simplifying manufacturing.

In addition, FIG. 3 shows a cross-sectional view that illustrates a typical super-luminescent LED as having a "Distributed Bragg Reflector" (DBR) or layer stack assembly comprising layered sections 16. Materials like AlGaInP or AlGaAs are preferably used in forming DBR layers 16 (FIGS. 1, 2, and 3), which typically includes a mirror stack of more than "20" layers. The DBR layer 16 is primarily used to eliminate the absorption of the fundamental light produced by and emitted from the active-area layer 17B by the substrate-layer 14, thereby increasing extraction efficiency of the prior art super-luminescent LED. Prior art, describes the DBR 16 (FIGS. 1, 2, and 3) as being typically grown onto the top and outermost surface 15 of a substrate-layer 14.

Furthermore, to better understand the structural differences between the present FCLED invention and art super-luminescent LED prior art technology, a typical example of a prior art high-frequency "Super-Luminescent Light Emitting Diode" (SLLED) design is described in detail below. Furthermore, prior art as illustrated in FIGS. 5, 6, 7, 8, 9 and 10 shows a SLLED design that is slightly different than the SLLED design described previously. However, while this new SLLED design still uses the well-known process of recombination "electron/hole" radiation (i.e., what is sometimes called "radiative recombination") to produce intra-cavity fundamental light it is only conductive at its diode active-region. The prior art, illustrated in FIGS. 5, 6, 7, 8, 9 and 10 to begin with shows a high-frequency version of a SLLED design that uses a metallic supporting substrate 22 (FIGS. 5, 6, 7, and 8) as both a base-reflecting mirror structure 22 and as a substrate-layer that is used for the subsequent growth of its various multilayered structures. This is where SLLEDs typically begin the process of epitaxially growing contiguous layers using a well-known epitaxial process like "Molecular Beam Epitaxy" (MBE) or "Metal Organic Chemical Vapor Deposition" (MOCVD) for material deposition.

Furthermore, a SLLED's metallic supporting substrate 22, when made conductive, as an alternative embodiment, would serve as the SLLED(s) electrically negative electrode. The metallic supporting substrate 22 is comprised from a (Ni—Al) "Nickel-Aluminum" alloy-mixture, which has between an "8.0" to a "12.0" percent material lattice-mismatch, or more specifically, a "10.0" percent material lattice-mismatch to the binary (GaN) "Gallium-Nitride" semiconductor material deposited later. Nevertheless, despite a (Ni—Al) "Nickel-Aluminum" lattice-mismatch it is still the preferred metallic alloy-mixture used for this kind of electron conducting metallic supporting substrate 22. In addition, the (Ni—Al) "Nickel-Aluminum" metallic supporting substrate 22 (FIG. 7), if used as an alternative embodiment, would also need to exhibit a highly reflective property as well and, therefore should have a surface roughness of less than "15" atoms thick.

Furthermore, prior art as illustrated in FIGS. 5, 6, 7, 8, 9 and 10 shows several thin layers of (AlN) "Aluminum-Nitride" material, which are grown layer-upon-layer using MBE or MOCVD as the deposition process, until a buffer-layer 23 (FIG. 7) is built up epitaxially that has a thickness of only a few atoms. This buffer-layer 23 is used for facilitating the "Molecular Beam Epitaxy" (MBE) or "Metal Organic Chemical Vapor Deposition" (MOCVD) epitaxial growth of the many subsequent semiconductor layers that will entirely comprise the high-frequency SLLED device.

In addition, prior art as illustrated in FIGS. 5, 6, 7, 8, 9 and 10 shows that typically a high-frequency short-wavelength SLLED design would have a lower "Distributed Bragg Reflector" (DBR) or quarterwave mirror stack assembly 24 grown, epitaxially, onto the top and outermost surface of the previously mentioned buffer-layer 23A, 23B, 23C, 23D (FIGS. 5, 6, 7, and 8) of (AlN) "Aluminum-Nitride" material using any suitable epitaxial crystal growing method, such as MBE or MOCVD.

Moreover, prior art as illustrated in FIGS. 5, 6, 7, 8, 9 and 10 shows that a high-frequency SLLED's quarterwave mirror stack assembly 24 is made from a plurality of alternating layers comprising mirror pairs; or more precisely, as comprising a multitude of single pairs of alternating layers 24A, 24B (FIGS. 5, 6, 7, and 8), which are constructed from a pair of "Gallium-Nitride" and "Aluminum-Gallium-Nitride" (GaN/AlGaN) semiconductor materials that are used to complete a single mirror pair. A plurality of alternating layers, which include one or more layers of N-doped (GaN) "Gallium-Nitride" 24A, 24C, 24E, 24G, 24I (FIGS. 5, 6, 7, and 8), a high refractive semiconductor material, and N-doped (AlGaN) "Aluminum Gallium Nitride" 24B, 24D, 24F, 24H, 24J (FIGS. 5, 6, and 7), a low refractive semiconductor material.

For example, prior art as illustrated in FIGS. 5, 6, 7, 8, 9 and 10 shows that a layer 24A of N-doped (GaN) "Gallium-Nitride is epitaxially deposited onto the top and outermost surface of a SLLED's last buffer-layer 23D (FIGS. 5, 6, 7, and 8), while a layer 24B (FIGS. 5, 6, 7, and 8) of N-doped (AlGaN) "Aluminum Gallium Nitride" is subsequently and epitaxially deposited onto the top and outermost surface of the SLLED's first N-doped (GaN) "Gallium-Nitride layer 24A, which form a SLLED's first single mirror pair. If additional mirror-pairs are required, several more layers are used to make-up additional mirror-pairs, which are deposited, epitaxially, onto the existing layers of (GaN) "Gallium-Nitride and (AlGaN) "Aluminum Gallium Nitride" materials 24A, 24B, 24C, 24D, 24E, 24F, 24H, 24I (FIGS. 5, 6, 7, and 8).

Moreover, to increase the reflectivity of a SLLED's quarterwave mirror stack assembly 24 (FIGS. 5, 6, 7, and 8) to any required amount of reflectance, many additional mirror pairs may be required, and depending on the frequency of light being reflected, as many as several hundred pairs might be needed and used. However, it should be understood that the thickness and doping levels of each deposited layer used within a prior-art SLLED design must be precisely controlled. Any deviation from designed parameters, no matter how slight, would affect the performance of a prior-art SLLED device (i.e., frequency range, flux intensity). This greatly adds to the cost and complexity of manufacturing high frequency SLLED devices.

For example, prior art as illustrated in FIGS. 5, 6, 7, 8, 9 and 10 shows that a SLLED's emitter-layer 32 (FIGS. 5, 6, 7, and 8), because it was designed to emit super-luminescent high-frequency light having a wavelength of "200" nanometers, should also have a material thickness that is the same as the other alternating layers used to comprise the SLLED's quarterwave mirror stack assembly 24, which in both cases have material thickness' one-quarter of one wavelength of the optical radiation emitted by the SLLED device in question. Prior art as illustrated in FIGS. 5, 6, 7, 8, 9 and 10 also shows that typically all layers used to comprise a SLLED's quarterwave mirror stack assembly 24 (FIGS. 5, 6, 7, and 8) shall, therefore have a material thickness of "50" nanometers.

Furthermore, the doping of a SLLED device is accomplished by the addition of various dopant materials (e.g., n-type electron donating dopants like Phosphorus and p-type electron accepting dopants like Boron) to epitaxial materials used in the MBE or MOCVD epitaxial deposition process of epitaxially deposited materials. Typically, a SLLED device will use many different dopant concentrations of specific dopant materials within the several different extrinsic semiconductor layers that make-up a SLLED's various planar structures. For example, alternating layers of (GaN) "Gallium-Nitride" 23A (FIGS. 5, 6, 7, and 8) and N-doped (AlGaN) "Aluminum Gallium Nitride" 23B (FIGS. 5, 6, 7, and 8), which are used to facilitate construction of a SLLED's quarterwave mirror stack assembly 24 (FIGS. 5, 6, 7, and 8) can be made n-type and, therefore conductive, when doped with either "Selenium" or "Silicon" using a dopant concentration ranging from "1 E15" to "1 E20" cubic-centimeters with a preferred range from "1 E17" to "1 E19" cubic centimeters, while a nominal concentration range of doping would be from "5 E17" to "5 E18" cubic centimeters. The percentage of dopant composition used in a SLLED's quarterwave mirror stack assembly 24 could be stated as (Al x Ga x N/GaN), where x represents a variable of "0.05" to "0.96", while in a preferred embodiment x would represent an amount greater than "0.8".

Therefore, prior art as illustrated in FIGS. 5, 6, 7, 8, 9 and 10 shows that once the plurality of alternating layers used in a SLLED's first quarterwave mirror stack assembly 24 have been deposited onto the top and outermost surface of the SLLED's buffer-layer of (AlN) "Aluminum-Nitride" 23, then the SLLED's first contact-layer 25 (FIGS. 5, 6, 7, and 8), which is comprised from a highly+n-doped (GaN) "Gallium-Nitride" binary semiconductor material can be epitaxially grown onto the top and outermost surface of the last alternating layer of the SLLED's quarterwave mirror stack assembly 24 (FIGS. 5, 6, 7, and 8). A SLLED's first contact-layer 25, while providing connectivity to the SLLED's n-metal contact 27 (FIGS. 5, 6, 7, and 8), and to the SLLED's n-metal contact-ring 26 (FIGS. 5, 6, 7, and 8), will also enhance the reliability of the SLLED's design by preventing the migration of carrier-dislocations, and the like to the SLLED's active-region 28 (FIGS. 5, 6, 7, and 8).

Furthermore, prior art as illustrated in FIGS. 5, 6, 7, 8, 9 and 10 shows that to prevent the overcrowding of the cladding-layers within a SLLED's active-region 28, each cladding-layer is shown as being single and separate 28A, 28C (FIGS. 5, 6, 7, and 8). It should also be understood that each cladding-layer could be made using more than one layer, where each cladding-layer 28A, 28C is epitaxially deposited onto a previous cladding-layer, while each cladding-layer 28A, 28C is comprised from N-doped or P-doped (AlGaN) "Aluminum-Gallium-Nitride" ternary semiconductor material, or any other suitable doped material available.

Furthermore, prior art as illustrated in FIGS. 5, 6, 7, 8, 9 and 10 shows that a SLLED's active-region 28 (FIGS. 5, 6, 7, and 8), which is shown as being represented by a single layer is as presented here comprised as a (SQW) "Single Quantum Well" epitaxially deposited onto the top and outermost surface of the SLLED's first cladding-layer 28A (i.e., sometimes called a cladding-barrier). It should be understood, however, that a SLLED's active-region 28 could also include one or more quantum-well cladding-layers and quantum-well layers, as is typical of MQW structures, or more particularly a first quantum-well cladding-layer and a second quantum-well cladding-layer, with a quantum-well layer positioned between them. Prior art as illustrated in FIGS. 5, 6, 7, 8, 9 and 10 shows that a SLLED's active-area 28B is comprised as a SQW, which is constructed from a p-doped (InGaN) "Indium-Gallium-Nitride" extrinsic ternary semiconductor material, using MBE or MOCVD to epitaxially deposit the material onto the first cladding-layer 28A.

In addition, prior art as illustrated in FIGS. 5, 6, 7, 8, 9 and 10 shows that a SLLED's second contact-layer 29 (FIGS. 5, 6, 7, and 8), which is comprised from a highly+p-doped (GaN) "Gallium-Nitride" extrinsic binary material is epitaxially grown onto the top and outermost surface of the SLLED's second cladding-layer 28C. A SLLED's second contact-layer 29, while providing connectivity to the SLLED's p-metal contact 31 (FIGS. 5, 6, 7, and 8) and to the SLLED's p-metal contact-ring 30 (FIGS. 5, 6, 7, and 8) will also enhance the reliability of the SLLED's design by preventing the migration of carrier-dislocations, and the like to the SLLED's active-region 28.

In addition, prior art as illustrated in FIGS. 5, 6, 7, 8, 9 and 10 shows that a SLLED's emitter layer 32 (FIGS. 5, 6, 7, and 8), which is constructed from un-doped (ZnO) "Zinc-Oxide" a high-refractive dielectric material is shown as being the last layer in the SLLED device to be deposited. In addition, prior art as illustrated in FIGS. 5, 6, 7, 8, 9 and 10 shows that a SLLED's p-metal contact 31 and the SLLED's p-metal contact-ring 30 are formed onto the top and outermost surface of the SLLED's second contact-layer 29 (FIGS. 5, 6, 7, and 8) by disposing any suitable conductive material, such as Indium-Tin-Oxide, Gold, Zinc, Platinum, Tungsten, or Germanium metallic alloys. Prior art as illustrated in FIGS. 5, 6, 7, 8, 9 and 10 also shows that a SLLED's n-metal contact 27 (FIGS. 5, 6, 7, and 8) and the SLLED's n-metal contact-ring 26 (FIGS. 5, 6, 7, and 8) are formed onto the top and outermost surface of the SLLED's first contact-layer 25 (FIGS. 5, 6, 7, and 8) by disposing any suitable conductive material, such as Indium-Tin-Oxide, Gold, Zinc, Platinum, Tungsten, or Germanium metallic alloys.

Furthermore, it should also be understood that a chosen method of material deposition depends upon which material is selected for a SLLED's electrical contacts 27, 31 (FIGS. 5, 6, 7, and 8). Therefore, specific methods of material disposition, disposing, and patterning onto the SLLED's first and second contact-layers 25, 29, for any specific material, must be considered in the construction of the SLLED's electrical contacts 27, 31 (FIGS. 5, 6, 7, and 8).

Moreover, prior art as illustrated in FIGS. 5, 6, 7, 8, 9 and 10 shows that a SLLED's second contact-layer 29 (FIGS. 5,

6, 7, and 8), a SLLED's second cladding-region 28C, a SLLED's active-area 28B, and a SLLED's first cladding-layer 28A (FIGS. 5, 6, 7, and 8) are all mesa-etched structures; moreover, defining the overall shape and structure of the SLLED's lower layers, while their diameter dimensions remain substantially larger than the SLLED's top deposited emitter layer 32 (FIGS. 5, 6, 7, and 8) and the emitter-layer's support 29. As mesa etching is completed a SLLED's p-metal contact 31 (FIGS. 5, 6, 7, and 8), and the SLLED's p-metal contact-ring 30 (FIGS. 5, 6, 7, and 8) are deposited onto the top and outermost surface of the SLLED's second contact-layer 29 leaving, therein the SLLED's emitter-layer area open 32.

In addition, the deposition of a SLLED's n-metal contact, as an alternative embodiment, can be deposited onto the top and outermost surface of the SLLED's metallic supporting substrate 22 (FIGS. 5, 6, 7, and 8) of (Ni—Al) "Nickel-Aluminum" alloy, which would allow the metallic supporting substrate 22 to function as an electrically negative contact-layer. Prior art as illustrated in FIGS. 5, 6, 7, 8, 9 and 10 shows a SLLED's metallic supporting substrate-layer 22, when it is used in conjunction with a quarterwave mirror stack assembly 24 (FIGS. 5, 6, 7, and 8) constructed from mirror pairs of highly reflective (AlGaN/GaN) "Aluminum-Gallium-Nitride/Gallium-Nitride" material, provide for approximately "99.99" percent of the SLLED's total reflectivity. Furthermore, prior art as illustrated in FIGS. 8, 9, and 10 shows how high-frequency SLLED devices can be grouped together and configured as a linear array of high-frequency super-luminescent light emitting diodes.

SUMMARY OF THE INVENTION

In accordance with the present invention a super-luminescent folded cavity light emitting diode would have a cavity folding waveguide that comprises at least one total internally reflecting waveguide prism, which provides for the redirection of intra-cavity produced fundamental photonic radiation into and out of intra-cavity transverse propagation, a semiconductor double-heterojunction diode active-region that comprises an active-area, which provides for the production of fundamental photonic radiation, a photon collimating and photon focusing window emitter-layer, which is capable of collimating and focusing sufficient undiffused optical radiation into a propagation direction away from the present invention's optically folded vertical cavity.

Objects and Advantages

Accordingly, besides the objects and advantages of the Super-Luminescent Folded Cavity Light Emitting Diode described in the above patent, several objects, and advantages of the present invention are:

(a) To provide a super-luminescent folded cavity light emitting diode that creates a high output of wide spectral light without using a quarterwave mirror stack assembly, but instead uses a cavity folding internal reflecting polyhedral prism waveguide, which is comprised from a single layer of dielectric or semiconductor material that is anisotropic or amorphous;

(b) To provide a super-luminescent folded cavity light emitting diode that is inexpensive to manufacture by eliminating the expensive epitaxial deposition of a bottom positioned quarterwave mirror stack assembly comprising a multitude of dielectric or semiconductor layers constructed using anisotropic or amorphous materials, and replacing it with a single dielectric polyhedral prism waveguide, which is constructed from a single inexpensive layer of sputter or epitaxially deposited material;

(c) To provide a super-luminescent folded cavity light emitting diode that uses two graded confinement cladding-layers to generate higher output emission;

(d) To provide a super-luminescent folded cavity light emitting diode that produces a more effective output gain using two graded confinement cladding-layers to lower the heat which is produced by electrical resistance between current conducting contact-layers and cladding-layers;

(e) To provide a super-luminescent folded cavity light emitting diode, which increases optical confinement with the addition of total internal reflecting cladding material to the surrounding vertical and outermost wall surfaces of the diode's folded vertical cavity(s);

(f) To provide a super-luminescent folded cavity light emitting diode, which can be configured and controlled as a single light emitting diode device;

(g) To provide a super-luminescent folded cavity light emitting diode, which can be configured as a single diode-array that comprises a multitude of diodes, which are controlled as a single group of light emitting diode devices (i.e., sometimes called a diode-array) or controlled as a single group of independently controlled light emitting diodes;

(h) To provide a super-luminescent folded cavity light emitting diode or a super-luminescent folded cavity light emitting diode-array, which can be manufactured at the same time and from the same semiconductor substrate material used to construct the laser-array's control-circuitry, all of which, would be contained within a single integrated semiconductor device;

(j) To provide a super-luminescent folded cavity light emitting diode that replaces a bottom quarterwave mirror stack assembly with a polyhedral prism waveguide which, if comprised of quartz or fused silica, can reflect one-hundred percent all frequencies of optical radiation entering a polyhedral prism waveguide's top front-face flat horizontal surface using a process of total internal reflection;

(k) To provide a super-luminescent folded cavity light emitting diode, which can inexpensively construct its polyhedral prism waveguide using a well-known ion-milling process to slice out the waveguide's prism facet(s);

(l) To provide a super-luminescent folded cavity light emitting diode that can deposit a dielectric material like fused-silica onto any construction material that might be used to construct any frequency producing semiconductor diode or combination thereof that could possibly be used to construct a super-luminescent folded cavity light emitting diode or a super-luminescent folded cavity light emitting diode-array;

(m) To provide a super-luminescent folded cavity light emitting diode, which uses an amorphous material like "Lithium-Fluoride" (LiF) to create, for a vertical cavity or vertical cavities, an optical cladding material layer that is thermally dispersive and gives added support to a diode(s) polyhedral prism waveguide structure(s);

(n) To provide a super-luminescent folded cavity light emitting diode that increases its spectral-linewidth by applying anti-reflection coatings to its polyhedral prism waveguide(s);

(o) To provide a super-luminescent folded cavity light emitting diode that has eliminated the need to predeposit buffer layers of crystal growing materials like "Aluminum-Nitride" onto a diode(s) substrate layer;

(p) To provide a super-luminescent folded cavity light emitting diode that produces an increase of nearly 7-mW to its output emission of fundamental light;

(q) To provide a super-luminescent folded cavity light emitting diode that can decrease its optical gain by coating its polyhedral prism waveguide's facets with an anti-reflection material.

Further objects and advantages are to provide a super-luminescent folded cavity light emitting diode, where the selection of one semiconductor material over another, or the selection of one anisotropic or amorphous optical material over another that might be used in the construction of the super-luminescent folded cavity light emitting diode's active-region, polyhedral prism waveguide, and emitter layers is not determined by any structural need or lattice compatibility, but by an application's need for specific frequency(s). The materials used in the construction of the present invention, as presented here, are only, one, yet preferred, example of a group of several frequency-specific materials that might be used to construct the present invention's frequency-transcendent multilayered structure. The advantage is that the novel features and the un-obvious properties that lie behind a super-luminescent folded cavity light emitting diode's cavity folding structure, because they can exist, and occur, using any frequency-specific semiconductor or optical material, shows that the various structures that comprise the super-luminescent folded cavity light emitting diode(s) have a sufficient novelty and a non-obviousness independent of any one particular semiconductor or optical material that might or could be used in the super-luminescent folded cavity light emitting diode(s) construction. Still further objects and advantages will become apparent from a consideration of the ensuing description and drawings.

DRAWING FIGURES

In the drawings, closely related figures have the same number but different alphabetic suffixes.

FIG. 20A shows an orthographic plan-view of the present invention's conical shaped polyhedral prism waveguide, which displays the raytraced pathway of an internally reflected light-ray.

FIG. 20B shows a three-dimensional isometric top side-view of the present invention's conical shaped polyhedral prism waveguide, which displays the raytraced pathway of an internally reflected light-ray.

FIG. 21 shows a schematic drawing that displays the typical energy profiles for the multiple quantum-well active-areas used by the FCLED design.

REFERENCE NUMERALS IN DRAWINGS

Figure 1:
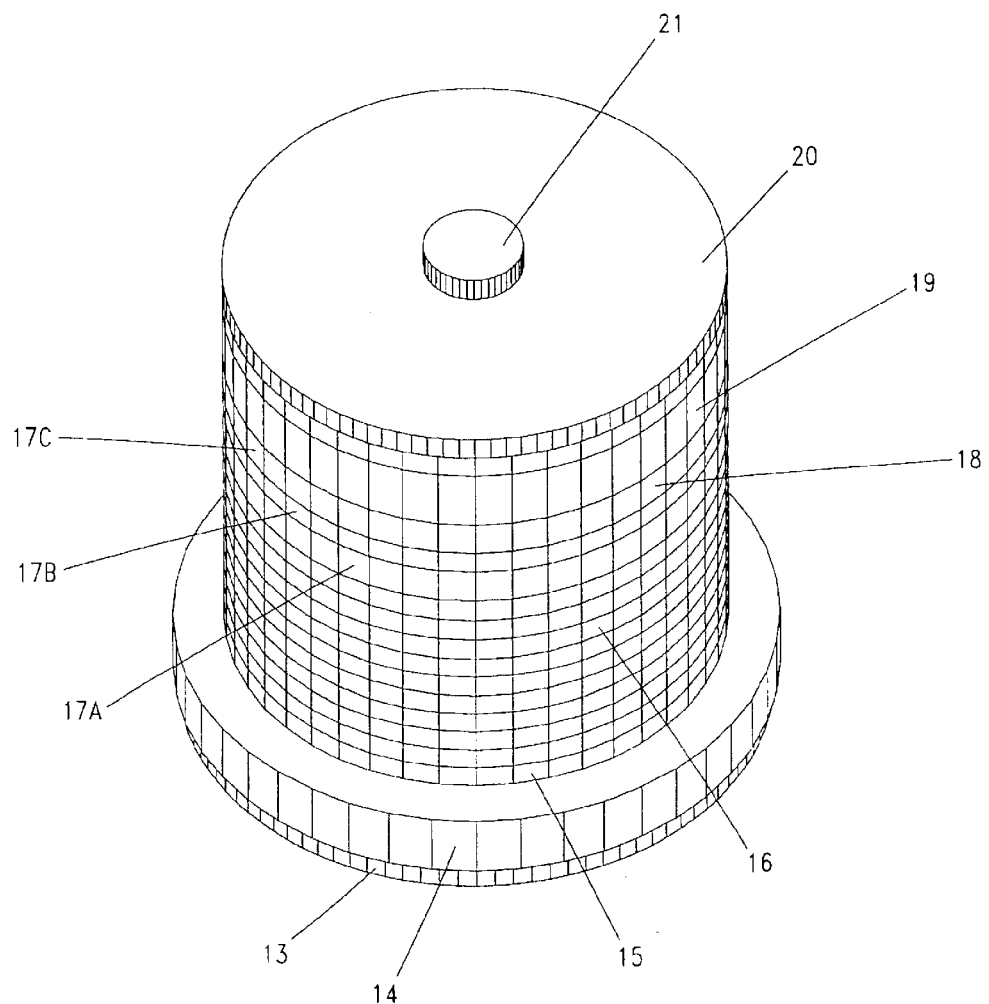
FIG. 1 shows prior art, illustrated as a three-dimensional sixty-degree isometric top front-view drawing of a current conducting SLLED, which displays a multilayered structure comprising a substrate-layer, a quarterwave mirror stack assembly, an active-region, and a window-layer.
Figure 2:
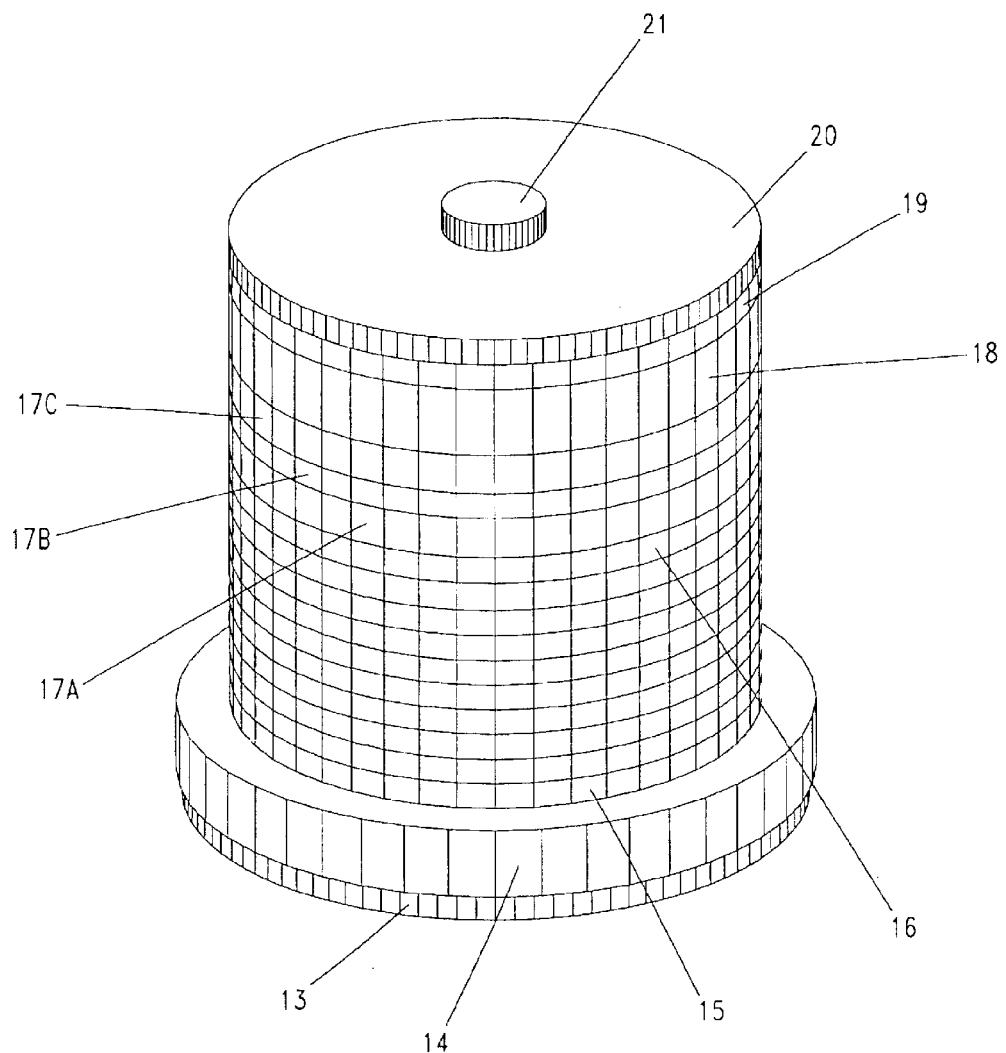
FIG. 2 shows prior art, illustrated as a three-dimensional thirty-degree isometric top front-view drawing of a current conducting SLLED, which displays a multilayered structure comprising a substrate-layer, a quarterwave mirror stack assembly, an active-region, and a window-layer.
Figure 3:
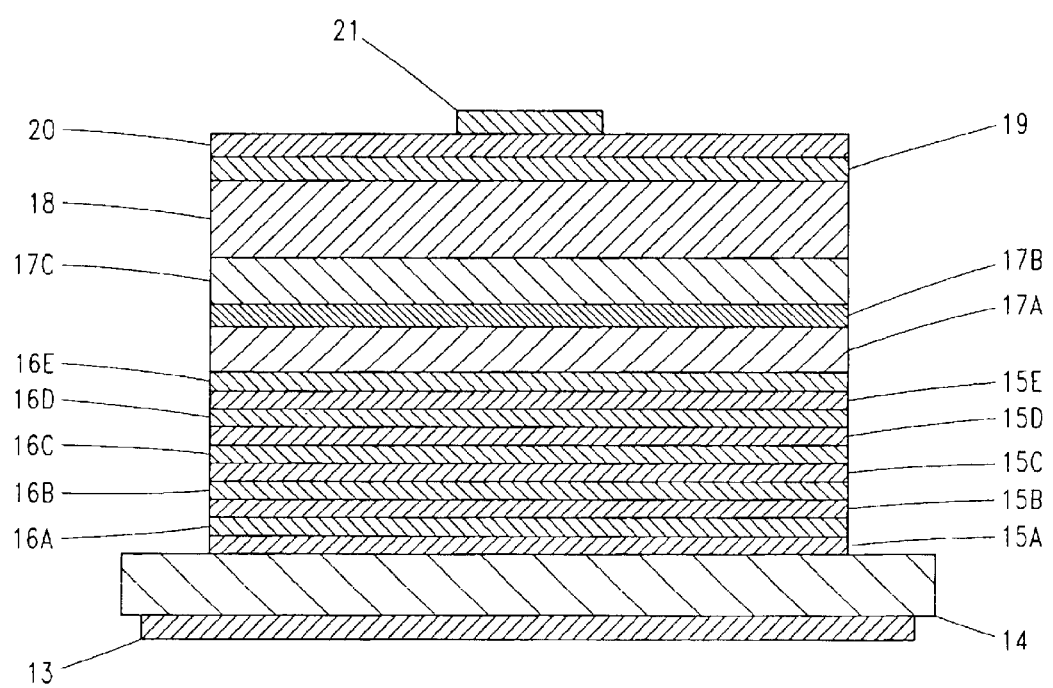
FIG. 3 shows prior art, illustrated as an orthographic vertical-section side-view drawing of a current conducting SLLED, which displays a multilayered structure comprising a substrate layer, a quarterwave mirror stack assembly, an active-region, and a window-layer.
Figure 4:
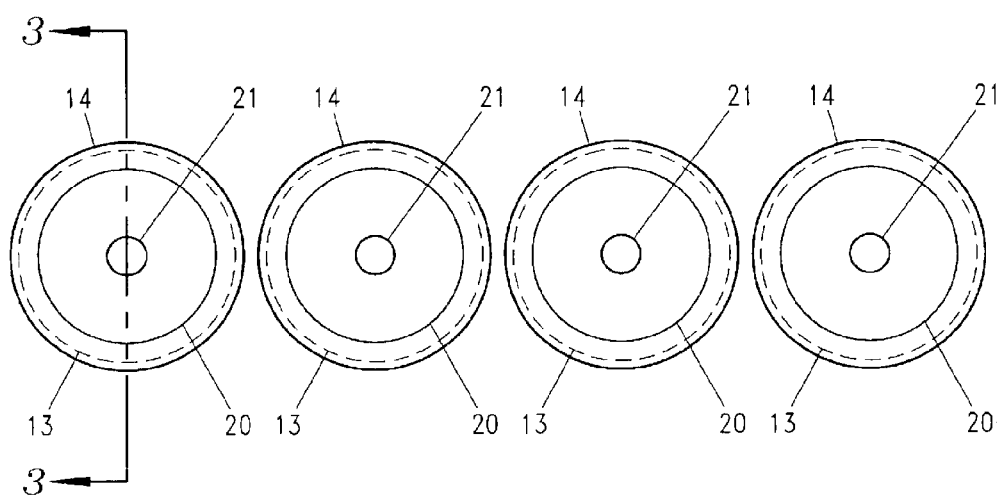
FIG. 4 shows prior art, illustrated as an orthographic top plan-view drawing, which displays a linear array of four current conducting SLLEDs, while showing section line 3—3.

In the drawings, closely related reference numerals have the same number but different alphabetic suffixes.

11 circular-concentric light-collimating and light-focusing outer grove.
12 collimated and focused light-rays.
13 n-type connector.
14 n-doped substrate-layer.
15 n-doped substrate-layer's growth surface.
16 n-doped quarterwave mirror stack assembly.
17 MQW active-region.
18 p-doped window-layer.
19 p-doped contact-layer.
20 conductive transparent oxide-layer.
21 p-type connector.
22 n-doped metal supporting substrate.
23 n-doped buffer-layer.
24 n-doped quarterwave mirror stack assembly.
25 +n-doped contact-layer.
26 n-metal contact-ring.
27 n-metal contact.
28 SQW active-region.
29 +p-doped contact-layer.
30 p-metal contact-ring.
31 p-metal contact.
32 window and emitter-layer.
34 corner-cubed shaped polyhedral prism waveguide.
35 +n-doped contact-layer.
36 MQW active-region.
37 +p-doped contact-layer.
38 light collimating and focusing window and emitter-layer.
39 optical cladding material.
40 raytraced pathway of a corner-cube waveguide propagating light-ray.
41 c-axis relative to a corner-cube shaped polyhedral prism waveguide.
42 right-angle shaped polyhedral prism waveguide.
43 raytraced pathway of a right-angle waveguide propagating light-ray.
44 c-axis relative to a right-angle shaped polyhedral prism waveguide.
45 conical shaped polyhedral prism waveguide.
46 raytraced pathway of a conical waveguide propagating light-ray.
47 c-axis relative to a conical shaped polyhedral prism waveguide.
48 circular-concentric light-collimating and light-focusing inner grove.
49 multiple quantum well layer.
50 multiple quantum well cladding-layer.
51 alternative+n-doped contact-layer.
52 alternative active-region.
53 alternative+p-doped contact-layer.
54 optically centered and gain-optimizing light-wave.
55 circular-concentric light-collimating and light-focusing outer grove.

DESCRIPTION—PREFERRED EMBODIMENT

Figure 11:
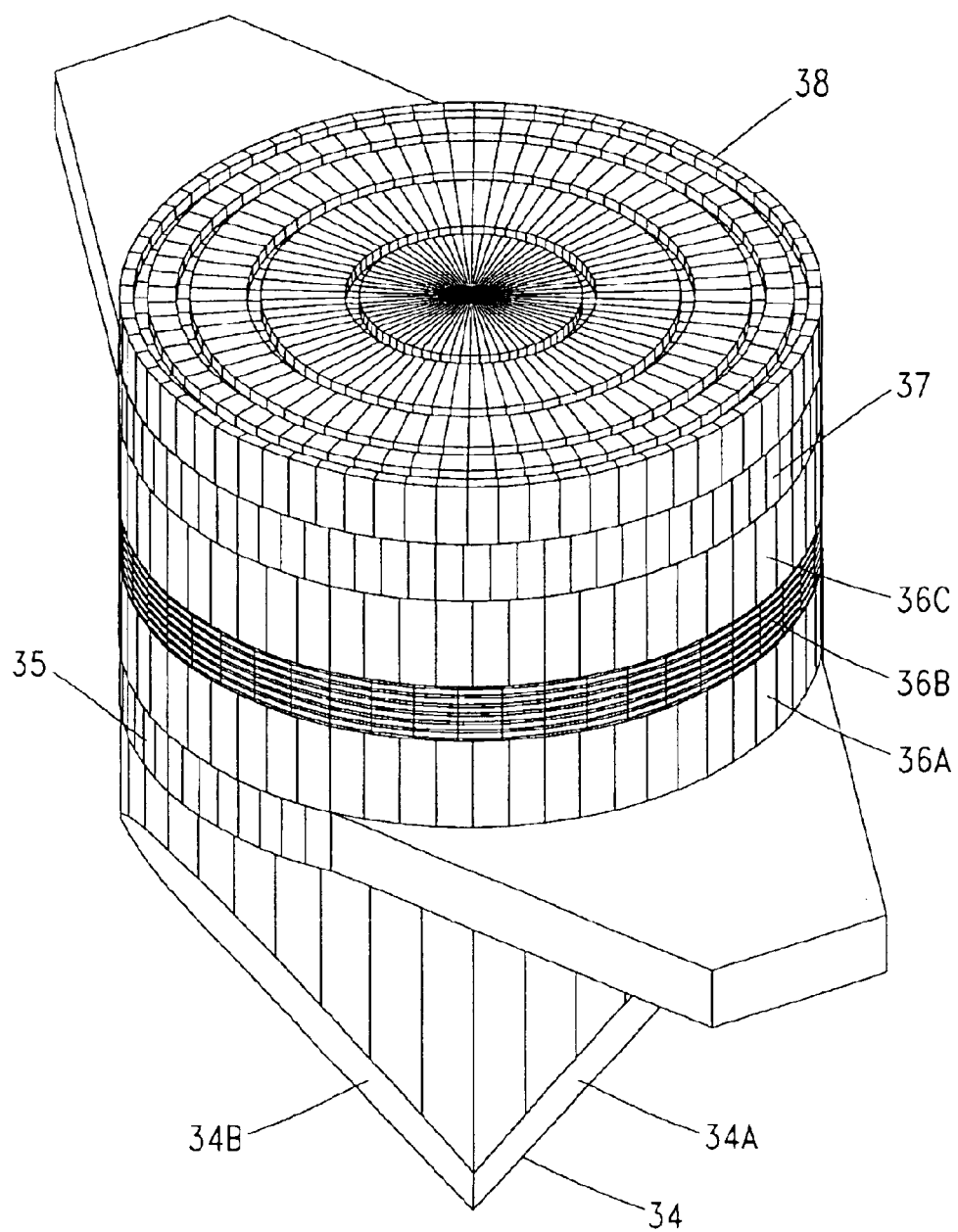
FIG. 11 shows the present invention, illustrated as a three-dimensional sixty-degree isometric top front-view drawing of a FCLED, which displays a multilayered structure comprising a cavity folding corner-cube shaped polyhedral prism waveguide, a MQW active-region, and a emitter window-layer.
Figure 12:
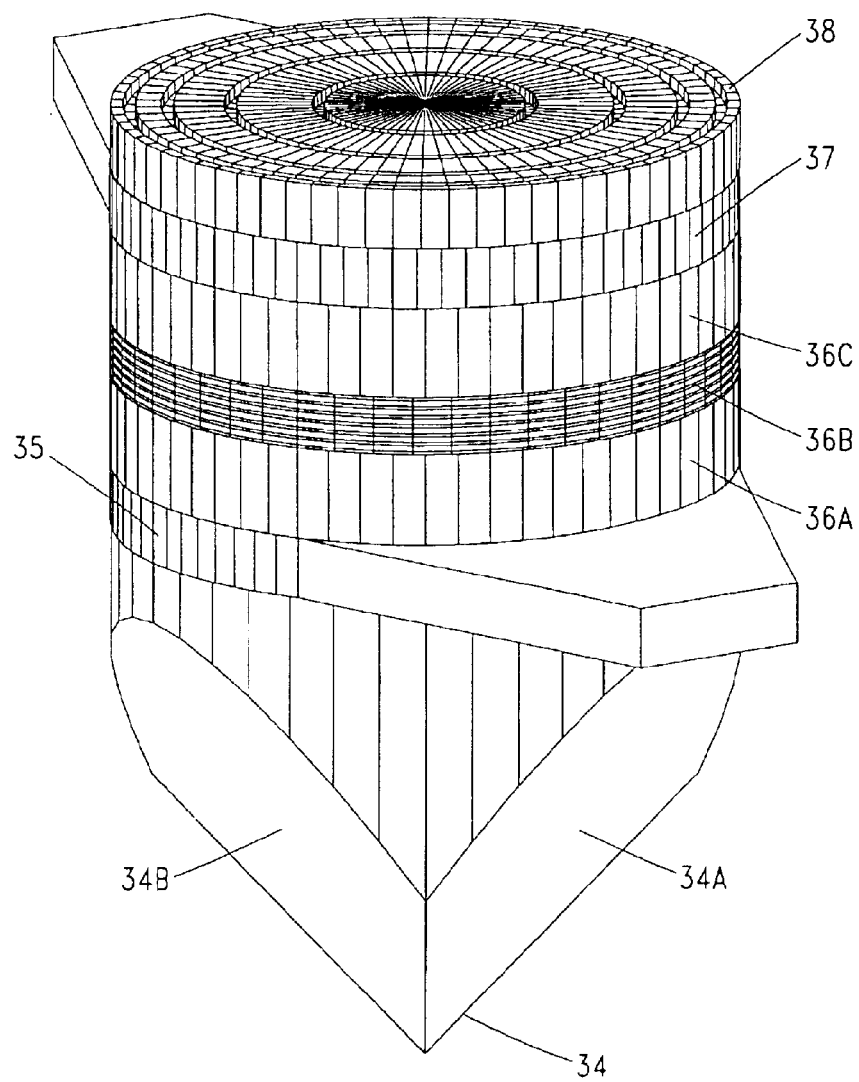
FIG. 12 shows an embodiment of the present invention, illustrated as a three-dimensional isometric bottom front-view drawing of FCLED.
Figure 13:
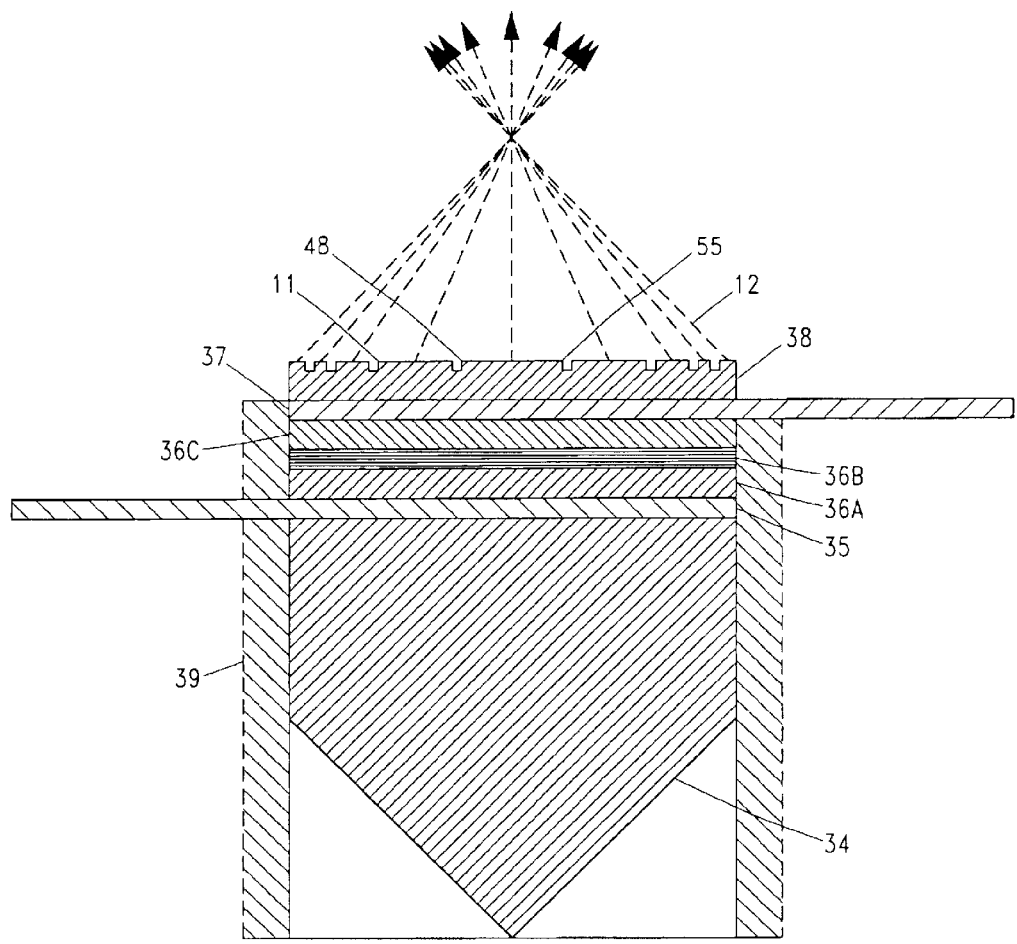
FIG. 13 shows the present invention, illustrated as an orthographic vertical-section side-view drawing of a FCLED, which displays a multilayered structure comprising an open optical cladding-layer, a cavity folding corner-cube shaped polyhedral prism waveguide, a MQW active-region, and a emitter window-layer.
Figure 14:
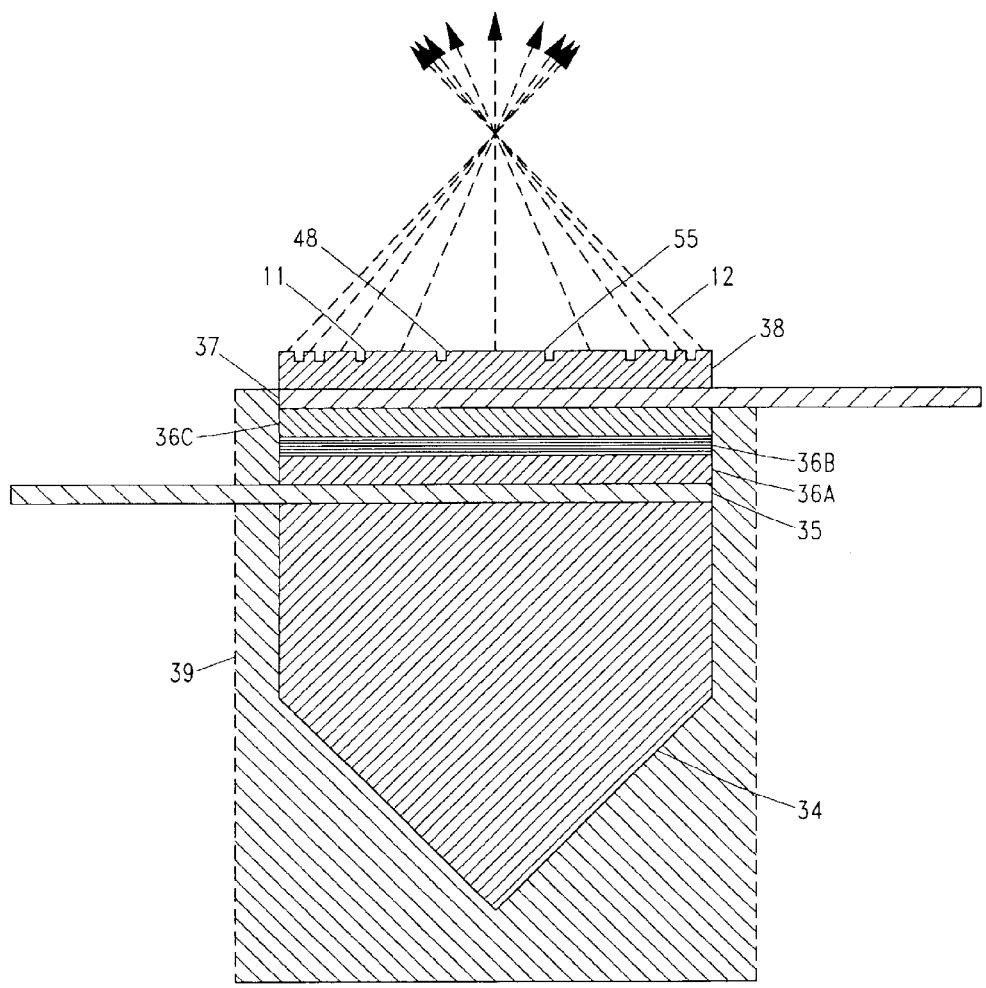
FIG. 14 shows the present invention, illustrated as an orthographic vertical-section side-view drawing of an alternative FCLED, which displays a multilayered structure comprising an closed optical cladding-layer, a cavity folding corner-cube shaped polyhedral prism waveguide, a MQW active-region, and a emitter window-layer.

A preferred embodiment of the present invention as illustrated in FIGS. 11 and 12 (i.e., two three-dimensional isometric-views of the FCLED, displaying numbered semiconductor multilayers), and in FIGS. 13 and 14 (i.e., a sectional side view drawing) shows that the present invention uses a double-heterostructure light emitting diode design, which is configured as the present invention's active-region 36 comprising a (MQW) "Multiple Quantum Well" active-area 36B (FIGS. 11, 12, 13, and 14), two contra-positioned graded confinement cladding-layers 36A, 36C (FIG. 11), a positive contact-layer 37 (FIG. 12), and a negative contact-layer that doubles as a crystal growing substrate layer 35 (FIGS. 13 and 14).

Wherein, the preferred double-heterostructure light emitting diode design improves the performance of the present FCLED invention in several ways:

(i) By replacing conventional non-graded confinement cladding-layers 28A, 28C (FIGS. 5, 6 and 7) 52A, 52E (FIG. 23) which are normally used in today's double-heterostructure diode designs with graded confinement cladding-layers 36A, 36C (FIGS. 11, 12, 13, and 14), we increase the confinement of both electrons and holes to a FCLED's MQW motive-area 363 (FIGS. 13 and 14). Because the graded confinement cladding-layers increase confinement of both electrons and holes to a FCLED's MQW active-area 36B (FIGS. 13 and 14), the process of "population inversion" occurring within the FCLED's MQW active-area 363 will also increase.

(ii) Because the graded confinement cladding-layers 36A, 36C (FIGS. 13 and 14) are created using a semiconductor material having a refractive index that changes gradually and evenly from high to low over the graded confinement cladding-layer's entire thickness, a high degree of reflectance is maintained, while the light scattering losses normally caused by internal photonic reflections at the material boundaries of typical non-graded confinement cladding-layers 28A, 28C (FIGS. 5, 6 and 7) 52A, 52E (FIG. 23) is eliminated greatly improving the gain and the spectral width of a FCLED's emission output.

(iii) By using graded confinement cladding-layers 36A, 36C (FIGS. 13 and 14) with an evenly graded distribution of dopant materials, where the amount of dopant levels are higher at the material boundaries between contact-layers and cladding-layers, we greatly reduce the resistance to electrical current at the previously mentioned material boundaries. In addition, by reducing resistance at the material boundaries between contact-layers and cladding-layers, we also increased current confinement, while reducing internally created and loss producing heat.

(iv) By using two graded confinement cladding-layers 36A, 36C (FIGS. 13 and 14) in conjunction with a MQW active-area 36B (FIGS. 13 and 14), which are both positioned between the FCLED's previously mentioned two contact-layers 35, 37 (FIGS. 13 and 14), we create a double-heterostructure semiconductor super-luminescent folded cavity light emitting diode that will have lower current thresholds, lower internal heat, higher output gain, and smoother emission output.

Moreover, when the present invention uses the preferred and previously mentioned double-heterostructure semiconductor (LED) "Light Emitting Diode" as its source of fundamental optical radiation we create a super-luminescent folded cavity light emitting diode that generates a higher-emission output that is greater than those produced by typical super-luminescent double-heterostructure semiconductor light emitting diode designs used today. Moreover, when the present invention uses the previously mentioned double-heterostructure semiconductor (LED) "Light Emitting Diode" as its source of fundamental optical radiation, because of the lower electrical resistance exhibited by its two graded confinement cladding-layers 36A, 36C (FIGS. 13 and 14) the FCLED's active-region 36 (FIGS. 13 and 14) will produce less heat and, therefore a more effective output gain, which is greater than the output gain typically exhibited by prior-art super-luminescent double-heterostructure semiconductor light emitting diode designs.

The preferred embodiment of the present invention as illustrated in FIGS. 11 and 12 (i.e., two three-dimensional isometric-views of the FCLED, displaying numbered semiconductor multilayers), and FIGS. 13 and 14 (i.e., a sectional side view drawing) shows that the construction of a FCLED begins with the creation of a FCLED's first "200" nanometers thick contact-layer 35 (FIGS. 13 and 14), which is formed from a pre-manufactured and pre-sliced semiconductor wafer comprised from a seed crystal of highly+n-doped (GaAs) "Gallium-Arsenide" binary material having a crystallographic orientation of <100>, <111>, <110>, or <001>, which is also used as the FCLED's main substrate for the subsequent growth of the FCLED's remaining crystalline semiconductor layers. A FCLED's first contact-layer 35 (FIGS. 13 and 14), while providing negative electrical connectivity to the FCLED's light emitting active-region 36 (FIG. 23), will also enhance the reliability of the FCLED's design, by preventing the migration of carrier-dislocations, and the like, to the FCLED's active-area 36B (FIGS. 13 and 14).

In addition, and next in line for deposition is a FCLED's first "300" nanometers thick graded confinement cladding-layer 36A (FIGS. 13 and 14), which is deposited, using MBE or MOCVD, onto the top of the outermost surface of the FCLED's first contact-layer 35, giving it the deposited position between the FCLED's first contact-layer 35 and the FCLED's active-area 36B.

Moreover, a FCLED's first graded confinement cladding-layer 36A (FIGS. 13 and 14) is comprised from a graded N-doped (GaAlAs) "Gallium-Aluminum-Arsenide" ternary material, where the concentration of "Gallium" gradient within the ternary material is gradually and smoothly increased starting from the first graded confinement cladding-layer's bottom outermost surface 36A (FIGS. 13 and 14), where the gradient is smoothly and continuously increased through the ternary material in a direction toward the FCLED's active-area 36B (FIGS. 13 and 14) until the first graded confinement cladding-layer's top outermost surface is reached. For example, starting from the first graded confinement cladding-layer's bottom outermost surface 36A (FIGS. 13 and 14) the amount of "Gallium" gradient is gradually increased from Ga0.55/Al/As, to Ga0.60/Al/As, to Ga0.65/Al/As, to Ga0.70/Al/As, to Ga0.75/Al/As, and finally to Ga0.80/Al/As 36A (FIGS. 13 and 14).

While, in contrast the concentration of "Aluminum" gradient within the same ternary material is gradually and smoothly decreased starting from the first graded confinement cladding-layer's bottom outermost surface 36A (FIGS. 13 and 14), where the gradient is smoothly and continuously decreased through the ternary material in a direction toward the FCLED's active-area 36B (FIGS. 13 and 14) until the first graded confinement cladding-layer's top outermost surface is reached. For example, starting from the first graded confinement cladding-layer's bottom outermost surface 36A (FIGS. 13 and 14) the amount of "Aluminum" gradient is gradually decreased from Ga/Al0.45/As, to Ga/Al0.40/As, to Ga/Al0.35/As, to Ga/Al0.30/As, to Ga/Al0.25/As, and finally to Ga/Al0.20/As 36A (FIGS. 13 and 14).

In addition, and layer next in line for deposition is a FCLED's single active-area 36B (FIGS. 13 and 14), which constitutes the FCLED's active medium. The active-medium, through a process of stimulated emission, will ultimately produce a wide spectral light at high output, where the previously mentioned active medium is optically pumped by intra-cavity produced fundamental light, which was created by the population inversion that occurs within the FCLED's double-heterostructure when the structure is electrically pumped.

Wherein, the previously mentioned active medium is described as being configured as a simple structure comprising either a single bulk semiconductor layer, or a single quantum well semiconductor layer, or multiple quantum well semiconductor layers having small forbidden bands, structures that define upon their deposition a FCLED's active-area, which is simply an area, when constructed as one of the layered structures mentioned above, is made optically active, while having a location within the FCLED's active-region 36 (FIGS. 13 and 14), usually between the active-region's 36 (FIGS. 13 and 14) cladding-layers, which is conducive to optical pumping.

Moreover, a FCLED's active-area 36B (FIGS. 13 and 14) is illustrated within the preferred embodiment as a multi-layered MQW structure that is positioned between the FCLED's first 36A (FIGS. 13 and 14) and second 36C (FIGS. 13 and 14) graded confinement cladding-layers. The previously mentioned multilayered MQW structure comprises seven quantum wells 49A, 49B, 49C, 49D, 49E, 49F, 49G (FIG. 22B), which are constructed from a binary (GaAs) "Gallium-Arsenide" semiconductor material with a small forbidden band width, and six quantum well cladding-layers 50A, 50B, 50C, 50D, 50E, 50F (FIG. 22B), which are constructed from a ternary (GaAlAs) "Gallium-Aluminum- Arsenide" semiconductor material with a very large forbidden band width. Importantly, all thirteen of the previously mentioned semiconductor layers that comprise a FCLED's active-area 36B (FIGS. 13 and 14), when combined, should form a MQW structure having a combined material thickness that is one-quarter of one wavelength of the fundamental light created by the FCLED's active-region 36 (FIGS. 13 and 14).

For example, if a FCLED's active-region 36 (FIGS. 13 and 14) were designed to create a fundamental light emission with a wavelength of "800" nanometers, then the active-area's 36B (FIGS. 13 and 14) total material thickness would need to be one-quarter (i.e., "200" nanometers) of one wavelength of the fundamental "800" nanometer light created by the previously mentioned FCLED's active-region 36 (FIGS. 13 and 14). Therefore, the combined thickness' of the previously mentioned multiple quantum well layers and multiple quantum well cladding-layers that make up the FCLED's active-area 36B should have a total material thickness of "200" nanometers, or one-quarter of one wavelength of the fundamental "800" nanometer light created by the FCLED's active-region 36 (FIGS. 13 and 14).

Furthermore, if a FCLED's active-area 36B (FIGS. 13 and 14) had seven quantum wells 49A, 49B, 49C, 49D, 49E, 49F, 49G (FIG. 22B) comprised from binary (GaAs) "Gallium-Arsenide" semiconductor material, the seven quantum wells 49A, 49B, 49C, 49D, 49E, 49F, 49G (FIG. 22B) would, each need to have a material thickness of about "10.30" nanometers. In addition, if a FCLED's active-area 36B had six quantum well cladding-layers 50A, 50B, 50C, 50D, 50E, 50F (FIG. 22B) comprised from ternary (GaAlAs) "Gallium-Aluminum-Arsenide" semiconductor material, the six quantum well cladding-layers 50A, 50B, 50C, 50D, 50E, 50F (FIG. 22B) would, each need to have a material thickness of about "21.30" nanometers. The thickness amounts for each of the seven quantum wells and six quantum well cladding-layers located within the FCLED's active-area 36B (FIGS. 13 and 14), when combined should have a total material thickness equal to "200" nanometers or one-quarter of one wavelength of the fundamental "800" nanometer light created by the FCLED's active-region 36 (FIGS. 13 and 14).

In addition, the preferred embodiment of the present invention as illustrated in FIG. 21, from an energy standpoint, shows a FCLED's MQW structure diagrammatically characterized. More specifically, FIG. 21 illustrates a profile of the potential wells and the discreet energy levels assumed by the carriers respectively in the conduction and valency bands (i.e., respectively electrons and holes). When, an epitaxy, semiconductor film having a small forbidden band e2 (e.g., a film with a typical thickness of about ten nanometers), such as films 49A, 49B, 49C, 49D, 49E, 49F, 49G (FIG. 22B), which are surrounded by two films having a larger forbidden band e0 (e.g., a film with a typical thickness of about twenty nanometers), such as films 50A, 50B, 50C, 50D, 50E, 50F (FIG. 22B), the previously mentioned electrons and holes of the small forbidden band material 49A, 49B, 49C, 49D, 49E, 49F, 49G (FIG. 22B) are confined in monodirectional potential wells e2.

Therefore, as illustrated in FIG. 21, the movement of an electron into a well created in the conduction band of height .DELTA.E.sub.c is quantified in discreet states of energy E.sub.1, E.sub.2, E.sub.3, etc.; moreover, in the same way, the movement of a hole into a well created in the valency band of height .DELTA.E.sub.x is quantified in discreet states of energy E'.sub.1, E'.sub.2, and E'.sub.3. When the thickness of the small forbidden bandwidth material e2 varies, the energy states assumed by the carriers also vary. Therefore, the emission length of the previously mentioned MQW structures can consequently be adjusted by the choice, the nature, and the thickness of the semiconductor material films used in their construction.

In addition, and next in line for deposition is a FCLED's second "300" nanometers thick graded confinement cladding-layer 36C (FIGS. 13 and 14), which is deposited using MBE or MOCVD onto the top and outermost surface of the FCLED's active-area 36B (FIGS. 13 and 14), giving it a deposited position between the FCLED's active-area 36B (FIGS. 13 and 14) and the FCLED's second contact-layer 37 (FIGS. 13 and 14). A FCLED's second graded confinement cladding-layer 36C (FIGS. 13 and 14) is comprised from a graded P-doped (GaAlAs) "Gallium-Aluminum-Arsenide" ternary semiconductor material, where the concentration of "Gallium" gradient within the ternary material is gradually and smoothly increased starting from the second graded confinement cladding-layer's top outermost surface 36C (FIGS. 13 and 14), where the gradient is smoothly and continuously increased through the ternary material in a direction toward the FCLED's active-area 36B (FIGS. 13 and 14) until the second graded confinement cladding-layer's bottom outermost surface is reached.

For example, starting from the second graded confinement cladding-layer's top outermost surface 36C (FIGS. 13 and 14) the amount of "Gallium" gradient is gradually increased from Ga0.55/Al/As, to Ga0.60/Al/As, to Ga0.65/Al/As, to Ga0.70/Al/As, to Ga0.75/Al/As, and finally to Ga0.80/Al/As 36C (FIGS. 13 and 14). While, in contrast the concentration of "Aluminum" gradient within the same ternary material is gradually and smoothly decreased starting from the second graded confinement cladding-layer's top outermost surface 36C (FIGS. 13 and 14), where the gradient is smoothly and continuously decreased through the ternary material in a direction toward the FCLED's active-area 36B (FIGS. 13 and 14) until the second graded confinement cladding-layer's bottom outermost surface is reached. For example, starting from the second graded confinement cladding-layer's top outermost surface 36C (FIGS. 13 and 14) the amount of "Aluminum" gradient is gradually decreased from Ga/Al0.45/As, to Ga/Al0.40/As, to Ga/Al0.35/As, to Ga/Al0.30/As, to Ga/Al0.25/As, and finally to Ga/Al0.20/As 36C (FIGS. 13 and 14).

In addition, and next in line for deposition is a FCLED's second "200" nanometers thick contact-layer 37 (FIGS. 13 and 14), which is comprised from a highly+p-doped (GaAs) "Gallium-Arsenide" binary semiconductor material that is epitaxially grown onto the top and outermost surface of the FCLED's second graded confinement cladding-layer 36C (FIGS. 13 and 14), giving it a deposited position between the FCLED's second graded confinement cladding-layer 36C (FIGS. 13 and 14) and the FCLED's light collimating and focusing window emitter-layer 38 (FIGS. 13 and 14). Moreover, a second contact-layer 37 (FIGS. 13 and 14), while providing positive electrical connectivity to the FCLED's active-region 36 (FIGS. 13 and 14), will also enhance the reliability of the FCLED's laser design, by preventing the migration of carrier-dislocations, and the like, to the FCLED's active-area 36B (FIGS. 13 and 14).

Figure 18A:
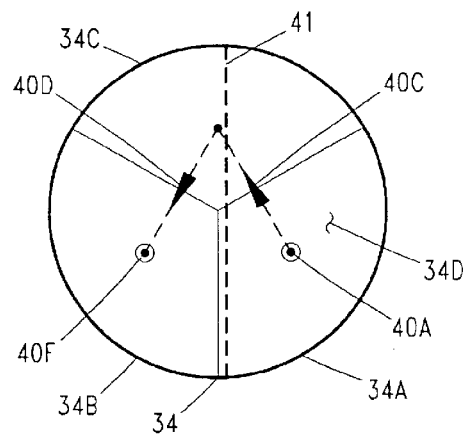
FIG. 18A shows an orthographic plan-view drawing of the present invention's corner-cube shaped polyhedral prism waveguide, which displays the raytraced pathway of an internally reflected light-ray.
Figure 18B:
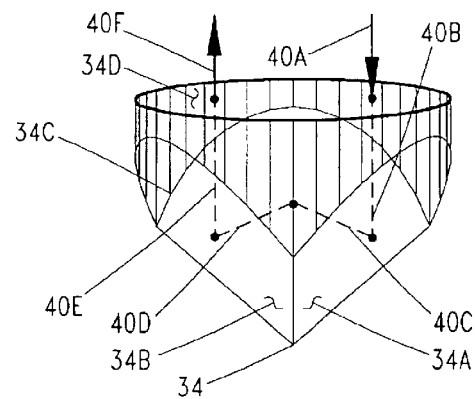
FIG. 18B shows a three-dimensional thirty-degree isometric top side-view of the present invention's corner-cube shaped polyhedral prism waveguide, which displays the raytraced pathway of an internally reflected light-ray.

In addition, and next in line for deposition is a FCLED's total internal reflecting corner-cube shaped polyhedral prism waveguide 34 (FIGS. 13 and 14) which, if comprised from Quartz or (SiO2) "Fused Silicon-Dioxide" (i.e., sometimes called fused silica) material, will internally reflect a "100" percent any wavelength of optical radiation that enters its plane-parallel, flat horizontal, and circular top front-face surface 34D. A FCLED's corner-cube polyhedral prism waveguide is exactly what its name implies a polyhedral based prism waveguide having the shape of a cube's corner 34 (FIGS. 13 and 14), which is cut off orthogonal to one of its (i.e., body-diagonal) triad axes, where the resultant polyhedral prism waveguide's top plane-parallel and flat horizontal surface is as a result formed into a planar-flat and circular surface 34D (FIGS. 18A and 18B). As a result, a FCLED's corner-cube polyhedral prism waveguide's three polyhedral prisms 34A, 34B, 34C will redirect internally any incoming light-rays 40A (FIGS. 18A and 18B) a "180" degrees backwards toward their original direction and light source, no matter what the light-rays' angle of incidence was when it entered the corner-cube polyhedral prism waveguide's plane-parallel, flat horizontal, and circular top front-face surface 34D, where an internally reflected light-ray is shifted laterally by an amount that depends upon the light-ray's point of entry.

Furthermore, a FCLED's corner-cube polyhedral prism waveguide 34, as illustrated in FIG. 18A (i.e., isometric three-dimensional-view) is displayed as a three-dimensional object that shows the corner-cube polyhedral prism waveguide with a raytraced pathway for a single incoming 40A (FIG. 18A) and outgoing 40F (FIG. 18A) light-ray that is incidental upon the corner-cube polyhedral prism waveguide's plane-parallel, flat horizontal, and circular top front-face surface 34D. A FCLED's corner-cube polyhedral prism waveguide 34, as illustrated in FIG. 18B (i.e., an orthographic top plan-view) is displayed as a three-dimensional object that shows the corner-cube polyhedral prism waveguide with a ray-traced pathway for a single incoming 40A (FIG. 18B) and outgoing 40F (FIG. 18B) light-ray that is incidental upon the corner-cube polyhedral prism waveguide's plane-parallel, flat horizontal, and circular top front-face surface 34D. The main function of illustrations FIGS. 18A and 18B is to describe, through the use of two simple geometric diagrams, how light-rays 40A when entering a FCLED corner-cube polyhedral prism waveguide's plane-parallel, flat horizontal, and circular top front-face surface 34D are internally redirected a "180" degrees backwards toward their originating light source 40F.

Moreover, when a light-ray 40A (FIGS. 18A and 18B) enters the plane-parallel, flat horizontal, and circular top front-face surface 34D (FIGS. 18A and 18B) of a FCLED's corner-cube polyhedral prism waveguide 34 (FIGS. 18A and 18B) it will first travel to one of the corner-cube polyhedral prism waveguide's three internal polyhedral prism facets, which are located in the waveguide's polyhedral shaped base 34A, 34B, 34C, where it 40B will be redirected 40C a "100" percent from a first internal polyhedral prism facet-face 34A, to a second internal polyhedral prism facet-face 34C, where it will be redirected 40D a "100" percent to a third internal polyhedral prism facet-face 34B (FIGS. 18A and 18B), where it 40E will be redirected a "100" percent up and out of the FCLED's corner-cube polyhedral prism waveguide's plane-parallel, flat horizontal, and circular top front-face surface 34D backwards 40F into the FCLED's vertical cavity for further amplification.

Figure 5:
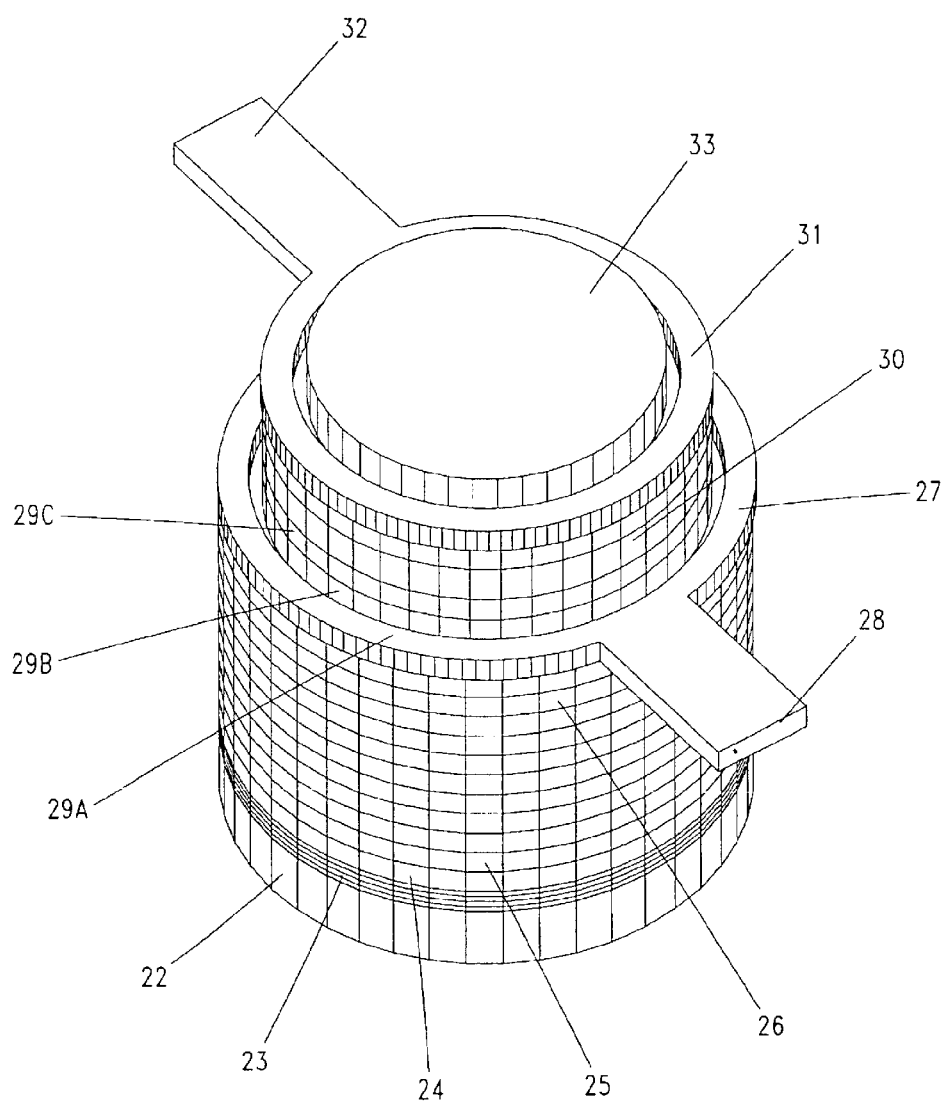
FIG. 5 shows prior art, illustrated as a three-dimensional sixty-degree isometric top front-view drawing of a non-current conducting SLLED, which displays a multilayered structure comprising a substrate layer, a quarterwave mirror stack assembly, an active-region, and an emitter window-layer.
Figure 6:
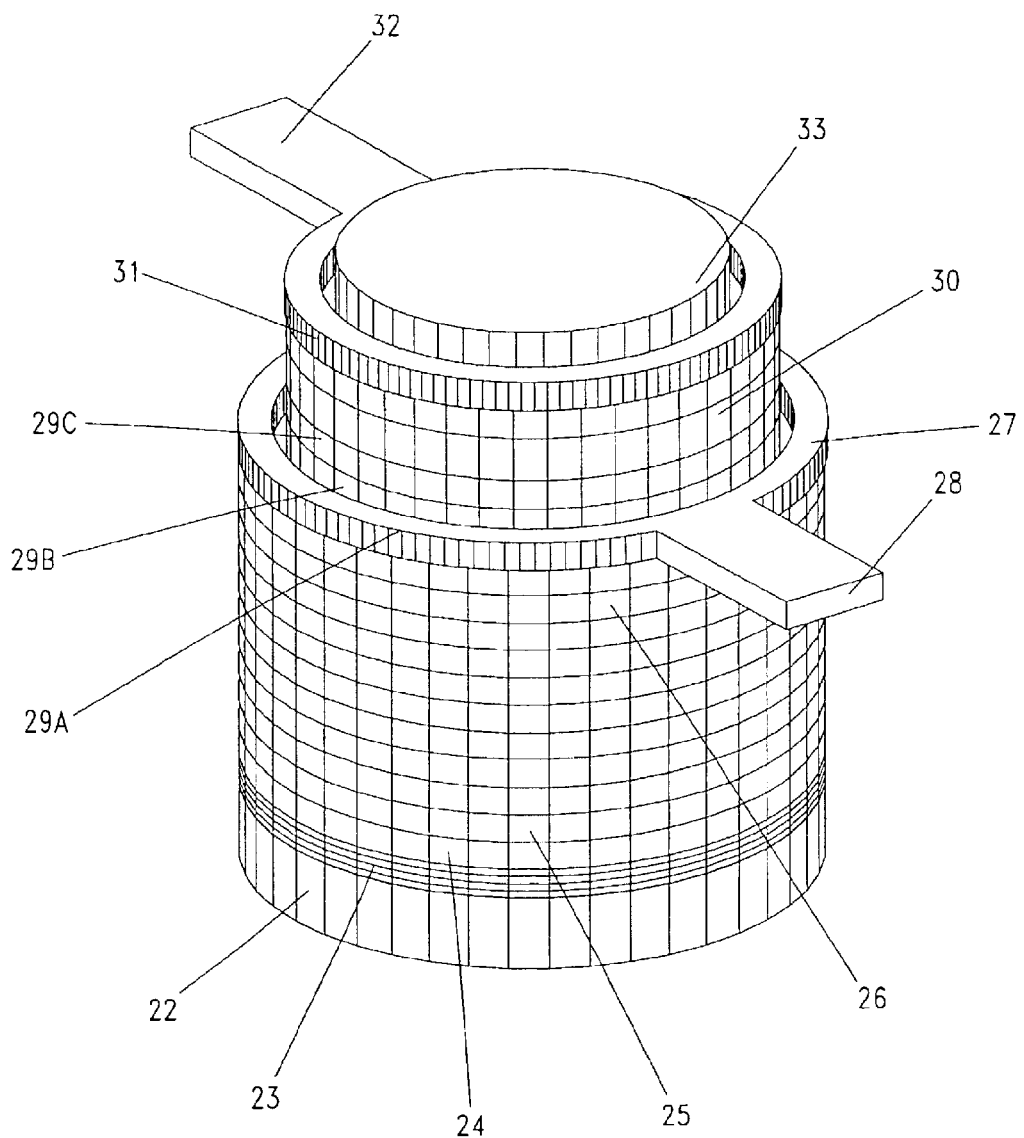
FIG. 6 shows prior art, illustrated as a three-dimensional thirty-degree isometric top front-view drawing of a non-current conducting SLLED, which displays a multilayered structure comprising a substrate layer, a quarterwave mirror stack assembly, an active-region, and an emitter window-layer.
Figure 7:
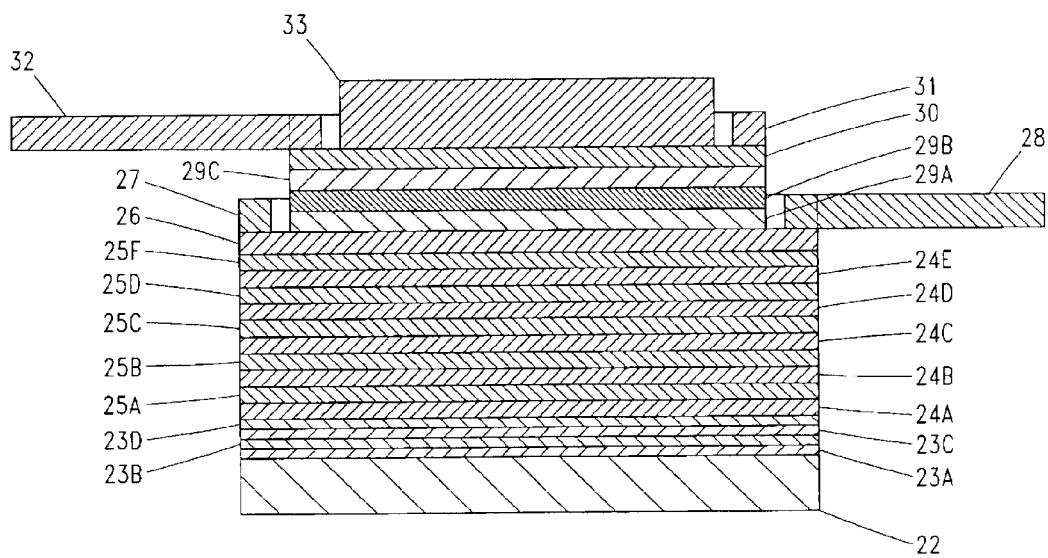
FIG. 7 shows prior art, illustrated as an orthographic vertical-section side-view drawing of a non-current conducting SLLED, which displays a multilayered structure comprising a substrate layer, a quarterwave mirror stack assembly, an active-region, and an emitter window-layer.
Figure 8:
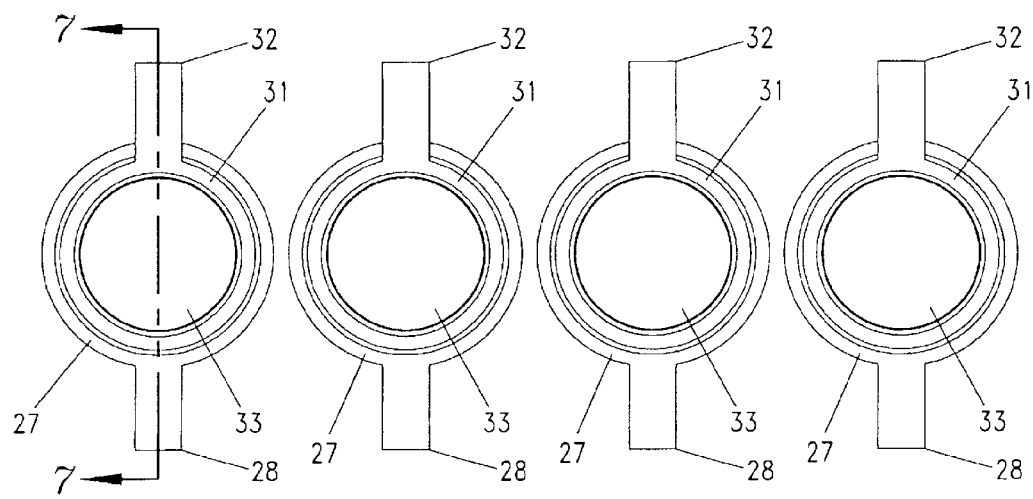
FIG. 8 shows prior art, illustrated as an orthographic top plan-view drawing, which displays a linear array of four non-current conducting SLLEDs, while showing section lines 7—7.
Figure 9:
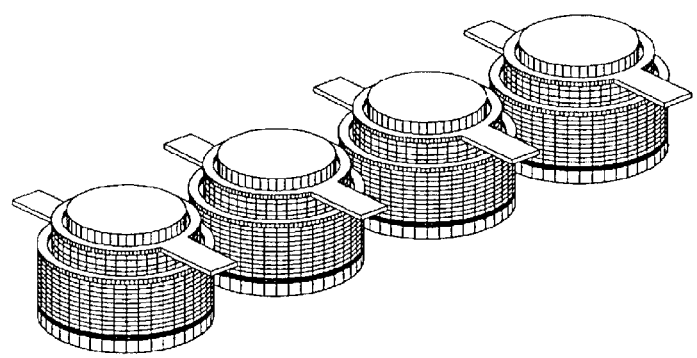
FIG. 9 shows prior art, illustrated as a three-dimensional isometric top-right side-view drawing of four non-current conducting SLLEDs, which are shown in a linear array configuration.
Figure 10:
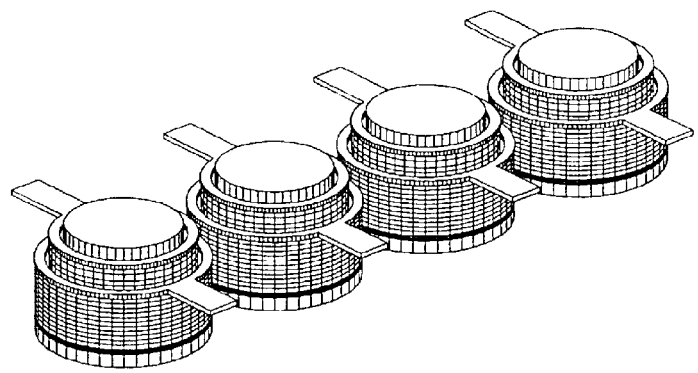
FIG. 10 shows prior art, illustrated as a three-dimensional isometric top-left side-view drawing of four non-current conducting SLLEDs, which are shown in a linear array configuration.

In addition, the preferred embodiment of the present invention as illustrated in FIGS. 11, 12, 13, 14, 15, 16, and 17 shows that a polyhedral prism waveguide 34 (FIGS. 18A and 18B), 42 (FIGS. 19A and 19B), 45 (FIGS. 20A and 20B) has replaced what is typically known in prior-art SLLED design as the first or base quarterwave mirror stack assembly. Typically, as illustrated in FIGS. 5, 6, 7, 9, and 10, a MBE or MOCVD epitaxial deposition of a mirror stack assembly 24 made from materials like (AlN) "Aluminum-Nitride" and (GaN) "Gallium-Nitride" (AlGaN) "Aluminum-Gallium-Nitride, can occur only after a crystal growing buffer-layer 23 of (AlN) "Aluminum-Nitride" is deposited onto the top and outermost surface of the metallic supporting substrate 22 (FIG. 7). However, by using a "Fused Silica" polyhedral prism waveguide 34, 42, 45 in place of the more typical quarterwave mirror stack assembly, the need for material buffering layers is completely eliminated. Furthermore, the location of a FCLED's polyhedral prism waveguide is at the base of the FCLED's vertical cavity; thereby, replacing the more conventional metallic alloy and/or sapphire substrates 22 and the planar-flat multilayered quarterwave mirror stack assemblies 24 (FIG. 7) that are normally used in prior-art SLLED designs, with a single layered monolithic structure 34, 42, 45 that is made from "Fused Silica" or some other optically appropriate material that transmits the desired frequencies of optical radiation.

Furthermore, unlike the quarterwave mirror stack assemblies normally used in prior-art SLLED designs, the polyhedral prism waveguides used in FCLEDs are monostructural (i.e., formed into a single shape from a single material) polyhedrons, which tend to be geometrically complex, but structurally simply, as opposed to the previously mentioned quarterwave mirror stack assemblies 24 (FIG. 7) used in prior-art SLLEDs, which tend to be geometrically simple, but structurally complex being comprised as multilayered structures having a multitude of thin-film planar-flat plates constructed from materials having alternate refractive indices.

Moreover, a FCLED's monostructural polyhedral prism waveguide 34, 42, 45 when constructed from Quartz or (SiO2) "Fused Silicon-Dioxide" are inexpensive to manufacture, are moisture resistant, are heat resistant, are non-conducting, and are easy to use in the construction of the before mentioned FCLEDs. Also, the previously mentioned (SiO2) "Fused Silicon-Dioxide" material is amorphous (i.e., a material made up of molecules that lack a distinct crystalline structure); therefore, the material also has an absolute lattice-mismatch to semiconductor materials like (GaAs) "Gallium-Arsenide" and (AlGaAs) "Aluminum-Gallium-Arsenide, and to other Zinc-blend semiconductor materials used in the construction of active-region layers, which tends to promote a greater reflectivity at the material interface that lies between a FCLED's first contact-layer 35 (FIG. 13) and the FCLED's polyhedral prism waveguide 34, 42, 45.

In addition, a FCLED's (SiO2) "Fused Silicon-Dioxide" polyhedral prism waveguide would also be optically transparent, optically transmitting, and optically reflective to all intra-cavity produced optical radiation with wavelengths ranging from the very-short "150" nanometers of ultraviolet radiation to the very-long "5000" nanometers of infrared radiation. Moreover, remembering that, it is the before mentioned polyhedral prism waveguide's monostructural geometry that gives it the ability to internally redirect all optical radiation that enters its plane-parallel, flat-horizontal, and circular top front-face surface 34D (FIGS. 18A and 18B), 42C (FIGS. 19A and 19B), 45B (FIGS. 20A and 20B). The FCLED design can decrease its optical gain by coating its polyhedral prism waveguide's facets with an anti-reflection material. The previously mentioned polyhedral prism waveguide works because it lengthens a FCLED's optical-cavity increasing the diffraction loss to intra-cavity produced fundamental light, thus decreasing gain to both fundamental and lower-order transverse optically moded light.

FIGS. 14, 15, 16, 17, 19, and 20—Additional Embodiments

Additional embodiments as illustrated in FIGS. 14, 15, 16, 17, 19, and 20 shows two different and additional embodiments of a FCLED's polyhedral prism waveguide which, if comprised of Quartz or (SiO2) "Fused Silicon-Dioxide" (i.e., sometimes called fused silica) material, will also reflect internally a "100" percent any wavelength of optical radiation that enters their plane-parallel, flat horizontal, and circular top front-face surfaces 34D (FIGS. 18A and 18B), 42C (FIGS. 19A and 19B), 45B (FIGS. 20A and 20B). The first additional embodiment, as illustrated in FIGS. 19A and 19B shows a FCLED's right-angle prism shaped polyhedral prism waveguide. Wherein, FIG. 19A (i.e., an isometric three-dimensional-view) displays an isometric three-dimensional-view drawing of a FCLED's right-angle prism shaped polyhedral prism waveguide 42 along with a raytraced pathway for an incoming 43A and outgoing 43E light-ray that is incidental upon the right-angle prism shaped polyhedral prism waveguide's plane-parallel, flat horizontal, and circular top front-face surface 42C (FIG. 19A).

Figure 19A:
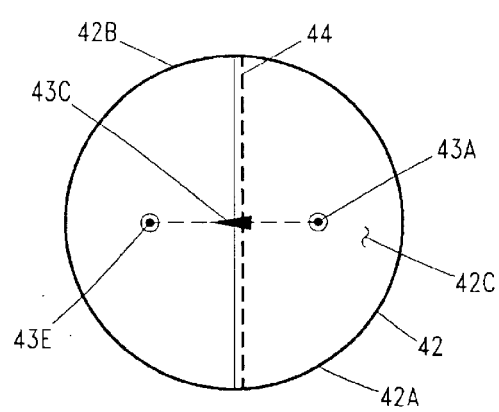
FIG. 19A shows an orthographic plan-view of the present invention's right angle shaped polyhedral prism waveguide, which displays the raytraced pathway of an internally reflected light-ray.
Figure 19B:
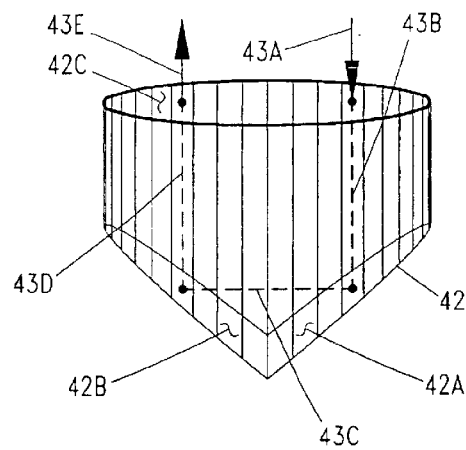
FIG. 19B shows a three-dimensional isometric top side-view of the present invention's right angle shaped polyhedral prism waveguide, which displays the raytraced pathway of an internally reflected light-ray.

In addition, FIG. 19B (i.e., an orthographic top plan-view) displays an orthographic plan-view drawing of a FCLED's right-angle prism shaped polyhedral prism waveguide 42 along with a raytraced pathway for an incoming 43A and outgoing 43E light-ray that is incidental upon of the FCLED's right-angle prism shaped polyhedral prism waveguide's top plane-parallel, flat horizontal, and circular front-face surface 42C (FIG. 19B). The main function of illustrations like FIGS. 19A and 19B is to describe, through the use of two simple geometric diagrams, how light-rays 43 (FIGS. 19A and 19B), when they enter a FCLED's right-angle prism shaped polyhedral prism waveguide's plane-parallel, flat horizontal, and circular top front-face surface 42C (FIGS. 19A and 19B) are internally reflected a "180" degrees backwards toward their originating light source 43E (FIGS. 19A and 19B).

Moreover, when a light-ray 43A (FIGS. 19A and 19B) enters the plane-parallel, flat horizontal, and circular top front-face surface 42C (FIGS. 19A and 19B) of a FCLED's right-angle prism shaped polyhedral prism waveguide 42 it will first travel to one of the waveguide's two internal polyhedral prism facet-faces, which are located in the waveguide's polyhedral shaped base 42A, 42B (FIGS. 19A and 19B), where it 43B (FIGS. 19A and 19B) will be redirected 43C (FIGS. 19A and 19B) a "100" percent into a "90" degree transverse direction from a first internal polyhedral prism facet-face 42A (FIGS. 19A and 19B), to a second internal polyhedral prism facet-face 42B (FIGS. 19A and 19B), where it will be redirected 43D (FIGS. 19A and 19B) a "100" percent into a "90" degree longitudinal direction up and out of the plane-parallel, flat horizontal, and circular top front-face surface 42D (FIGS. 19A and 19B) of the right-angle prism shaped polyhedral prism waveguide, backwards into the FCLED's vertical cavity 43E (FIGS. 19A and 19B) for further amplification and emission.

The second additional embodiment, as illustrated in FIGS. 20A and 20B shows a conical shaped polyhedral prism waveguide 45 which, if comprised from Quartz or (SiO2) "Fused Silicon-Dioxide" (i.e., sometimes called fused silica) material, will reflect internally a "100" percent any wavelength of optical radiation that enters its plane-parallel, flat horizontal, and circular top front-face surface 45B (FIGS. 20A and 20B). FIG. 20A (i.e., an isometric three-dimensional-view) displays an isometric three-dimensional-view of a conical shaped polyhedral prism waveguide 45 along with a raytraced pathway for an incoming 46A and outgoing 46E light-ray that is incidental upon the conical shaped polyhedral prism waveguide's plane-parallel, flat horizontal, and circular top front-face surface 45B (FIG. 20A).

In addition, FIG. 20B (i.e., an orthographic top plan-view) displays an orthographic plan-view of a conical shaped polyhedral prism waveguide 45 along with a raytraced pathway for an incoming 46A and outgoing 46E light-ray that is incidental upon of the conical shaped polyhedral prism waveguide's top plane-parallel, flat horizontal, and circular front-face surface 45B (FIG. 20B). The main function of the illustrations in FIGS. 20A and 20B is to describe, through the use of two simple geometric diagrams, how light-rays 46 (FIGS. 20A and 20B), when they enter a FCLED's conical shaped polyhedral prism waveguide's plane-parallel, flat horizontal, and circular top front-face surface 45B (FIGS. 20A and 20B) are internally reflected a "180" degrees backwards toward their originating light source 46E (FIGS. 20A and 20B). Moreover, when a light-ray 46A (FIGS. 20A and 20B) enters the plane-parallel, flat horizontal, and circular top front-face surface 45B (FIGS. 20A and 20B) of a FCLED's conical shaped polyhedral prism waveguide 45 (FIGS. 20A and 20B) it will first travel to the conical shaped polyhedral prism waveguide's single curved polyhedral prism facet-face 45A (FIGS. 20A and 20B), which is located at the waveguide's bottom 45A (FIGS. 20A and 20B), where it 46B (FIGS. 20A and 20B) will be redirected 47C (FIGS. 20A and 20B) a "100" percent into a "90" degree transverse direction from the curved internal polyhedral prism facet-face 45A (FIGS. 20A and 20B) to the other side of the curved internal polyhedral prism facet-face 45A (FIGS. 20A and 20B) where it will be redirected 46D (FIGS. 20A and 20B) a "100" percent into a "90" degree longitudinal direction, which is up and out of the FCLED's conical shaped polyhedral prism waveguide's plane-parallel, flat horizontal, and circular top front-face surface 45B (FIGS. 20A and 20B) backwards into the FCLED's vertical cavity for further amplification.

An additional embodiment of the present FCLED invention, as illustrated in FIGS. 11, 12, 13, 14, 15, 16, and 17 is a material distribution process used for the polyhedral prism waveguides 34, 43, 46 (FIGS. 18A, 18B, 19A, 19B, 20A, and 20B). When constructed from (SiO2) "Fused Silicon-Dioxide" the previously mentioned polyhedral prism waveguides are sputter deposited (i.e., using a known process of ION sputtering) onto the bottom and outermost surface of the FCLED's first+n-doped (GaAs) "Gallium-Arsenide" crystalline semiconductor contact-layer 35 (FIGS. 11, 12, 13, and 14), while the contact-layer's 35 top and outermost surface will be used as a crystal growing substrate, which will be the surface used to grow the FCLED's remaining crystalline semiconductor structures using MBE or MOCVD as a preferred method of layer deposition.

Furthermore, the reason why the top and outermost surface of a FCLED's first+n-doped (GaAs) "Gallium-Arsenide" crystalline semiconductor contact-layer 35 (FIGS. 11, 12, 13, and 14) is used as the crystal growing substrate for growing the FCLED's remaining crystalline semiconductor structures is that even though the polyhedral prism waveguide layer is deposited at the very bottom of a FCLED's optical cavity it cannot be used as crystal growing substrate. This is because (SiO2) "Fused Silicon-Dioxide" the dielectric material used in the construction of a FCLED's polyhedral prism waveguides is "amorphous" and therefore can never be used to grow the FCLED's succeeding layers of crystalline semiconductor materials.

To explain this further, (SiO2) "Fused Silicon-Dioxide" can never be used as a growth substrate for a MBE or MOCVD epitaxial deposition of a FCLED's succeeding layers of crystalline semiconductor materials because, during the process of MBE or MOCVD deposition, a deposited material, during its growth, will take on the same crystalline or non-crystalline molecular structure that is exhibited by its crystal growing substrate. Consequently, because a FCLED's polyhedral prism waveguides 34 (FIG. 18A and 18B), 42 (FIGS. 19A and 19B), 45 (FIGS. 20A and 20B) as defined within this additional embodiment are made from (SiO2) "Fused Silicon-Dioxide"; therefore, any crystalline semiconductor material, if epitaxially deposited upon its amorphous structure would, also during its growth, acquire the (SiO2) "Fused Silicon-Dioxide" material's amorphous non-crystalline structure and because the FCLED's succeeding layers of diode constructing material need to have a crystalline structure to function, (SiO2) "Fused Silicon-Dioxide" is useless as a material used in the crystal growing production of double-heterostructure light emitting diodes, crystalline quarterwave mirror stacks, and other crystalline structures that might be used to control the polarization, modulation, and frequency of the FCLED's output emissions.

Furthermore, the distribution of (SiO2) "Fused Silicon-Dioxide", if used in the construction of a FCLED's polyhedral prism waveguides 34 (FIGS. 18A and 18B), 42 (FIGS. 19A and 19B), 45 (FIG. 20A and 20B), would be done through a well known ion-sputtering process onto the bottom and outermost planar-flat surface that underlies the FCLED's first contact-layer 35 (FIGS. 11, 12, 13, and 14) and crystal growing substrate of +n-doped binary (GaAs) "Gallium-Arsenide" material. For example, a layer of (SiO2) "Fused Silicon-Dioxide" material, approximately "1000" nanometers thick, is sputter deposited onto the bottom and outermost surface of a FCLED's first contact-layer 35 (FIGS. 11, 12, 13, and 14) and crystal growing substrate of +n-doped binary (GaAs) "Gallium-Arsenide" material. Afterwards, lithography processes are used to remove the excess (SiO2) "Fused Silicon-Dioxide" material that surrounds a FCLED's polyhedral prism waveguide(s), revealing therein, a cylindrical shaped base-structure(s).

In addition, a well known ion-milling process is employed to slice out the polyhedral prism waveguide(s) 34 (FIGS. 18A and 18B), 42 (FIGS. 19A and 19B), 45 (FIG. 20A and 20B) polyhedral prism facets, while an optical material like (LiF) "Lithium-Fluoride" 39 (FIGS. 13 and 14), having a very low index of refraction is deposited, using a well known sputtering process, is sputter deposited around the FCLED's (SiO2) "Fused Silicon-Dioxide" polyhedral prism waveguide(s). If necessary the (LiF) "Lithium-Fluoride" 39 (FIGS. 13 and 14) optical cladding material can be partially removed later using a well-known ion-milling process, leaving the polyhedral prism waveguide's facets uncovered. The amorphous form of the before mentioned (LiF) "Lithium-Fluoride" cladding material 39 (FIGS. 13 and 14), while used as optical cladding material by a FCLED's optical cavity, will also add support and structural strength to the FCLED's polyhedral prism waveguide(s) 34 (FIGS. 18A and 18B), 42 (FIGS. 19A and 19B), 45 (FIG. 20A and 20B) as well.

Furthermore, it should be understood that within each FCLED device the thickness and doping levels of dopants within each layer is precisely controlled. Any deviation from a FCLED's designed parameters, no matter how slight, would affect the FCLED's performance (i.e., frequency range and flux intensity). For example, if a FCLED device were designed to emit light at a wavelength of around "800" nanometers the thickness of each alternating layer used in the FCLED's active-region 36 (FIGS. 13 and 14) would, typically each need to equal one-quarter of one wavelength of the fundamental "800" nanometer light produced by the FCLED's active-region. The doping of a FCLED's multi-layered structures is accomplished by the addition of various dopant materials (e.g., n-type electron donating dopants like Phosphorus and p-type electron accepting dopants like Boron) to the material layers that make-up each FCLED device. Typically, dopant material can be added during the MBE or MOCVD epitaxial process of material deposition. A FCLED device will use many different dopant concentrations of specific dopant materials within the several different extrinsic semiconductor layers that make-up the FCLED's various multilayered structures.

An additional embodiment of the present FCLED invention as illustrated by FIGS. 11, 12, 13, and 14 is the FCLED device configured as a single super-luminescent folded cavity light emitting diode. For example, a FCLED could be configured as a super-luminescent folded cavity light emitting diode device that is used in hardware applications like:

(i) In (AV) "Audio Video" record/playback multi-media recorders.

(ii) In (DVD) "Digital Video Disk" players.

(iii) In (CD) "Compact Disk" players.

(iv) In (WORM) "Write Once Read Many" data-storage devices constructed using single FCLED diodes.

(v) In (MPEG) "Motion Picture Expert Group" compact disk players and recorders constructed using single FCLED diodes.

(vi) In (MD) "Mini Disk" magneto-optical record/playback recorders.

(vii) In rear-projection big-screen television.

(viii) In magneto-optical flying-head data-storage hard disk drives.

(ix) In (DVD) "Digital Video Disk" ram-disk data-storage drives.

(x) In (MO) "Magneto Optical" removable disk drive mass-storage.

(xi) In a fiber optic gyroscope.

(xii) In short-haul fiber-optic communication transmitters.

Figure 15:
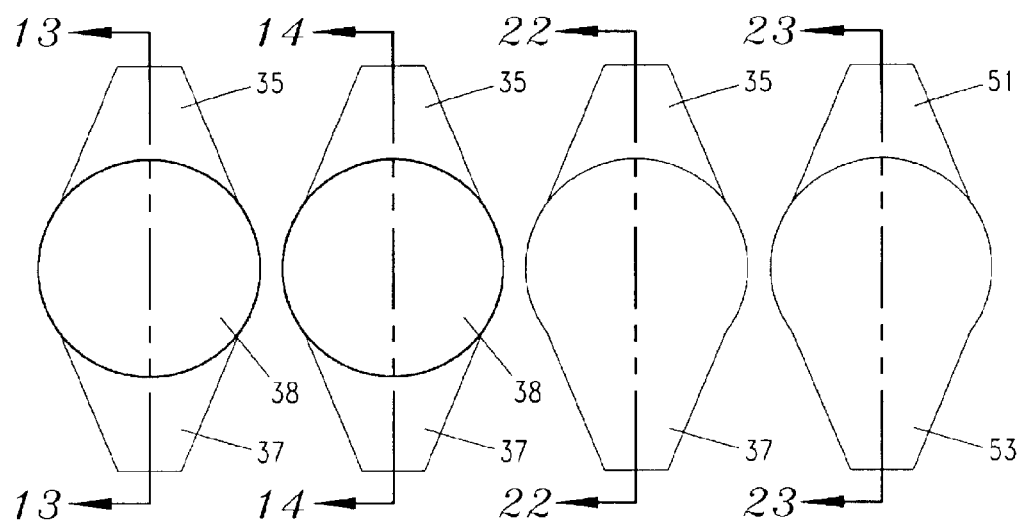
FIG. 15 shows the present invention, illustrated as an orthographic plan-view drawing, which displays a linear array of two FCLEDs and two FCLED active-regions, while showing section lines 13—13, 14—14, 22—22, and 23—23.
Figure 16:
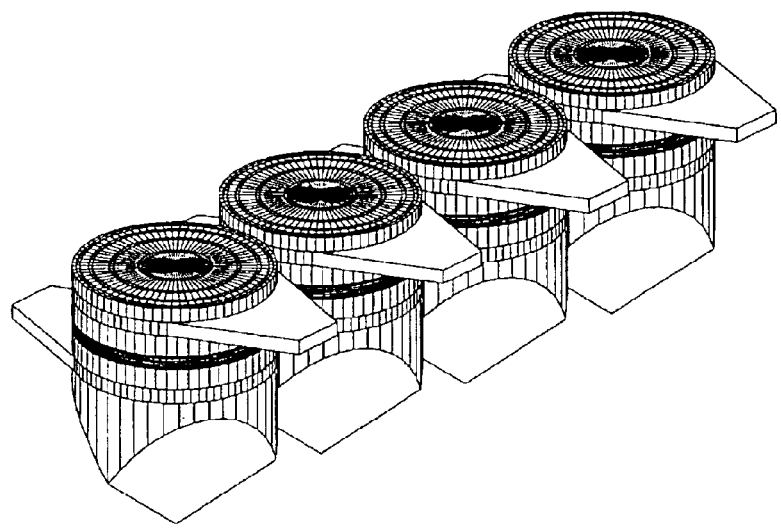
FIG. 16 shows the present invention, illustrated as a three-dimensional isometric top-right view drawing of four FCLEDs, which are shown in a linear array configuration.
Figure 17:
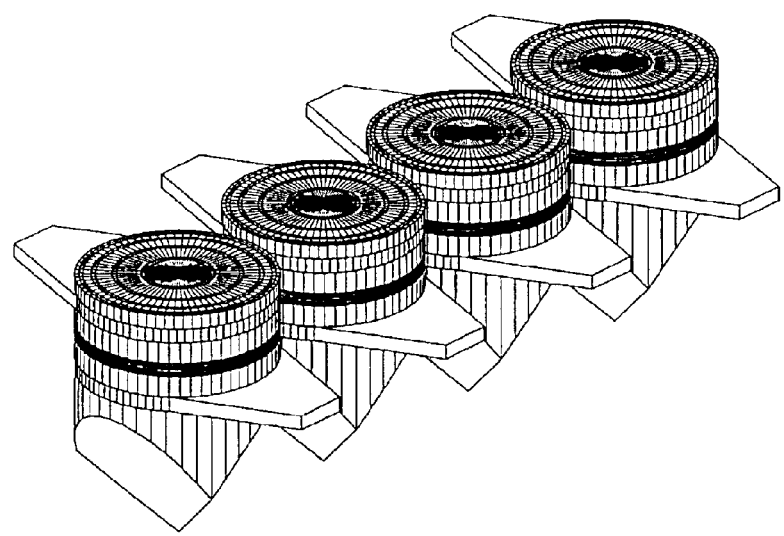
FIG. 17 shows the present invention, illustrated as a three-dimensional isometric top-left view of four FCLEDs, which are shown in a linear array configuration.

An additional embodiment of the present FCLED invention as illustrated by FIGS. 15, 16, and 17 is the FCLED device configured as a super-luminescent folded cavity light emitting diode-array. For example, a FCLED could be configured as a super-luminescent folded cavity light emitting diode-array for use in hardware applications like:

(i) In optically pumped solid-state lasers using a FCLED diode-array.

(ii) In video-display micro-screens using a FCLED diode-array.

(iii) In flatbed and hand-held scanners using a FCLED diode-array.

(iv) In laser printers using a FCLED diode-array.

An additional embodiment of the present FCLED invention describes how FCLEDs illustrated by FIGS. 15, 16, and 17 are configured as laser-arrayed devices, which are manufactured at the same time and from the same binary (GaAs) "Gallium-Arsenide" semiconductor substrate material that is used to construct the laser-array's control-circuitry, all of which, would be contained within a single integrated circuit semiconductor chip device.

Wherein, the individual FCLED diodes located within a single laser-array would be configured as singularly controlled and addressable diodes or configured as a single diode-array that is controlled as a single unit of diodes (i.e., a diode-array). The electronic control over both single FCLED diode-array devices or individual FCLED diodes that are located within a single FCLED diode-array is easily accomplished through a (GaAs) "Gallium-Arsenide" semiconductor based control-bus, memory-bus, and address-bus form of circuitry all of which are semiconductor circuits created from and contained upon the same semiconductor substrate material used to create the individual FCLED devices themselves. To explain further, (GaAs) "Gallium-Arsenide" circuitry can be created, along with the before mentioned FCLED devices from the same binary (GaAs) "Gallium-Arsenide" semiconductor substrate material. Integrating the before mentioned FCLED devices along with the before mentioned, control circuitry into a single surface mountable integrated semiconductor chip device.

An additional embodiment of the present FCLED invention as illustrated by FIGS. 13 and 14 shows the addition of a optical cladding material to the vertical and outermost wall surfaces of vertical cavity or cavities 39 of FCLED(s), where the optical cladding material has a refractive index less than the semiconductor crystalline materials used in the construction of FCLED vertical cavity(s). A optical cladding material 39 (FIGS. 13 and 14) is to be deposited around and between every lithographically or ion etched FCLED; surrounding every outermost wall-surface of every FCLED with an internal reflectivity that is "100" percent for any intracavity traveling light-ray, but only if the light-ray's angle of incidence upon the cladding-layer's 39 innermost wall surface has an internal angle of incidence equal to or greater than what is normally termed as the critical angle of internal reflection.

For example, the deposition of (LiF) "Lithium-Fluoride", an optical material, which possesses a much lower refractive index than the binary (GaAs) "Gallium-Arsenide" and the ternary (GaAlAs) "Gallium-Aluminum-Arsenide" materials used in the construction of a FCLED's vertical cavity. Wherein, the previously mentioned (LiP) "Lithium-Fluoride" is used as an optical cladding material, which is sputter deposited onto and around the outermost wall surfaces 39 (FIGS. 13 and 14) of a FCLED's vertical cavity, excluding the FCLED's "200" nanometers thick window emitter-layer 38 (FIGS. 13 and 14) which, being the last deposited layer in a FCLED device it is located at the very top of the FCLED's before mentioned active-region 36 (FIGS. 13 and 14). The deposition of optical cladding material to the FCLEDs' outermost wall surfaces will give added stability to the FCLEDs and their polyhedral prism waveguides, while helping to achieve a total internal reflectivity for the FCLEDs themselves. The introduction of vertically applied internal reflectivity will help reduce optical loses to a FCLED's optical cavity; wherein, the previously mentioned optical loses are normally caused by planar-mirror light-scattering and planar-mirror diffraction scattering.

Moreover, the application of optical cladding materials like (LiF) "Lithium-Fluoride" to the optical cavities of FCLEDs 39 (FIGS. 13 and 14), will create between the optical cavities of FCLEDs and the previously mentioned optical cladding material, an internal reflecting optical-barrier, which will confine to a FCLED's optical cavity, diode produced fundamental light. This process works in much the same way as fiber-optic technology does. Wherein, an optical cladding material having an lower refractive index than the material used within an optical fiber's core is deposited onto the outermost surface walls of that optical fiber's core, will achieve, "100" percent, a total internal reflectivity for any intra-fiber traveling light-ray whose angle of incidence upon the innermost wall surface of optical-fiber's cladding-layer has an internal angle of incidence equal to or greater than what is normally termed as the critical angle of internal reflection.

Figure 23:
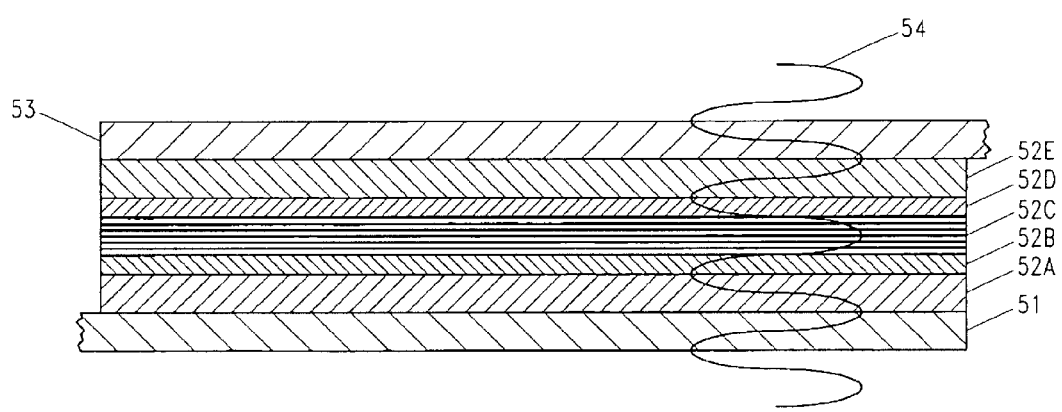
FIG. 23 shows a close-up side-view drawing of a vertical-section of a typical double-heterostructure active-region, which is shown as additional embodiment, while displaying the two primary un-graded confinement cladding-layers, the two secondary confinement heterostructure cladding-layers, and the active-area comprising multiple quantum-well layers and multiple quantum-well cladding-layers.

FIG. 23—Alternative Embodiment

An alternative embodiment to the present FCLED invention as illustrated in FIG. 23 shows an alternative embodiment to the preferred double-heterostructure light emitting diode design previously described in the preferred embodiment. The alternative embodiment, as illustrated in FIG. 23 is shown to be a double-heterostructure diode design, but is alternatively configured as an active-region 52 (FIG. 23) that comprises a (MQW) "Multiple Quantum Well" active-area 52C (FIG. 23), two primary contra-positioned non-graded confinement cladding-layers 52A, 52E (FIG. 23), two contra-positioned non-graded (SCH) "Separate Confinement Heterostructure" cladding-layers 52B, 52D (FIG. 23), one positive contact-layer 53 (FIG. 23), and one negative contact-layer and crystal growing substrate 51 (FIG. 23).

Furthermore, the alternative embodiment to the present FCLED invention as illustrated in FIG. 23 shows a double-heterostructure light emitting diode design whose order of layered deposition begins with the creation of a first "200" nanometers thick contact-layer 51 (FIG. 23), which is formed from a pre-manufactured and pre-sliced semiconductor wafer that was comprised from a seed crystal of highly+n-doped (GaAs) "Gallium-Arsenide" binary material having a crystallographic orientation of <100>, <111>, <110>, or <001>, which is later ultimately used as the main substrate for the subsequent growth of crystalline semiconductor layers that will make-up the diode's main electrical electron conducting structure. An alternative FCLED diode's first contact-layer 51 (FIG. 23), while providing negative electrical connectivity to the alternative FCLED diode's light emitting active-region 52 (FIG. 23), will also enhance the reliability of the alternative FCLED diode's design, by preventing the migration of carrier-dislocations, and the like, to the alternative FCLED diode's active-area 52C (FIG. 23).

In addition, the alternative embodiment of the present FCLED invention as illustrated in FIG. 23 shows a first "200" nanometers thick primary non-graded confinement cladding-layer 52A (FIG. 23), which is deposited, using MBE or MOCVD, onto the top and outermost surface of the alternative FCLED diode's first contact-layer 51, giving it a deposited position between the alternative FCLED diode's first contact-layer 51 and the alternative FCLED diode's first non-graded SCH cladding-layer 52B (FIG. 23). The alternative embodiment of the present FCLED invention as illustrated in FIG. 23 shows that the first "200" nanometers thick primary non-graded confinement cladding-layer 52A (FIG. 23) is comprised from an N-doped (AlGaAs) "Aluminum-Gallium-Arsenide" ternary semiconductor material.

In addition, the alternative embodiment to the present FCLED invention as illustrated in FIG. 23 shows a first "100" nanometers thick non-graded SCH cladding-layer 52B (FIG. 23) comprised from a n-doped (GaAlAs) "Gallium-Aluminum-Arsenide" ternary semiconductor material, which is deposited, using MBE or MOCVD, onto the top and outermost surface of the alternative FCLED diode's first primary non-graded confinement cladding-layer 52A (FIG. 23), giving it a deposited position between the alternative FCLED diode's first primary non-graded confinement cladding-layer 52A and the alternative FCLED diode's active-area 52C (FIG. 23). An alternative FCLED diode's first "100" nanometers thick non-graded SCH cladding-layer 52B is comprised from a material having an refractive index that is between the refractive index of the multiple quantum wells that will make-up the alternative FCLED diode's active-area 52 and the refractive index of the material that is used to construct the alternative FCLED diode's first primary non-graded confinement cladding layers 52A (FIG. 23).

In addition, the alternative embodiment of the present FCLED invention, as illustrated in FIG. 23, shows that next in line for material deposition is a active-area 52C (FIG. 23), which constitutes the FCLED's active medium, which, through a process of stimulated emission, will produce additional light when the previously mentioned active medium is optically pumped by the intracavity confined light created by the population inversion that occurs within the alternative FCLED diode's active-area 52C (FIG. 23), which is comprised as a MQW 52 (FIG. 23) structure that is located within the alternative FCLED diode's active-region.

In addition, the alternative embodiment of the present FCLED invention as illustrated in FIG. 23 shows that the previously mentioned active-area 52C is comprised as a multilayered MQW structure 52C (FIG. 23), which is positioned between the alternative FCLED's first and second non-graded SCH confinement cladding-layers 52B, 52D (FIG. 23) and comprises seven quantum well layers 49A, 49B, 49C, 49D, 49E, 49F, 49G (FIG. 22B) constructed from a binary (GaAs) "Gallium-Arsenide" semiconductor material having a small forbidden band width, and six quantum well cladding-layers 50A, 50B, 50C, 50D, 50E, 50F (FIG. 22B) constructed from a ternary (GaAlAs) "Gallium-Aluminum-Arsenide" semiconductor material having a very large forbidden band width. All thirteen of the previously mentioned semiconductor layers that make up an alternative FCLED's active-area 52C (FIG. 23), when combined, form a single MQW having a combined material thickness that is one-quarter of one wavelength of the fundamental light emission created by the alternative FCLED's active-region 52 (FIG. 23). For example, if an alternative FCLED's active-region 52 (FIG. 23) were designed to create light with a fundamental wavelength of "800" nanometers, than the alternative FCLED's active-area 52C would have a total material thickness one-quarter (i.e., "200" nanometers) of one wavelength of the fundamental "800" nanometer light created by the alternative FCLED's active-region 52.

Figure 22A:
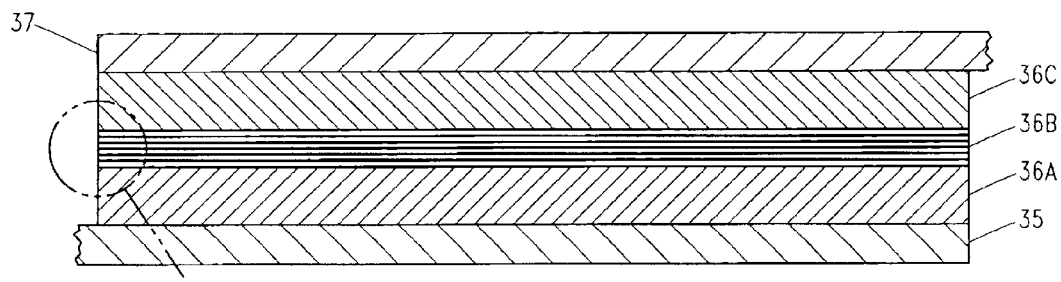
FIG. 22A shows a close-up side-view drawing of a vertical-section of a FCLED's active-region, which displays the active-region's two contact-layers, two gradually graded cladding-layers, and an active-area comprising a multiple quantum-well.
Figure 22B:
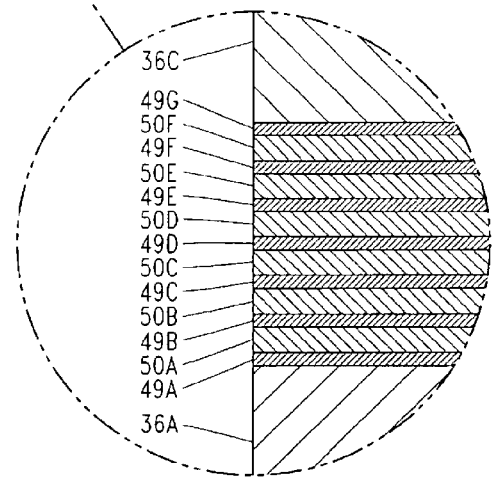
FIG. 22B shows an auxiliary close-up side-view drawing of a vertical-section of the active-region's active-area, which displays, along the active-region's outer-edge, details of the active-region's active-area.

Furthermore, if an alternative FCLED's active-area 52C (FIG. 23), as shown in FIG. 22B, had seven quantum wells 49A, 49B, 49C, 49D, 49E, 49F, 49G comprised from binary (GaAs) "Gallium-Arsenide" semiconductor material, the before mentioned seven quantum well layers would each need to have a material thickness of about "10.30" nanometers. Additionally, if an alternative FCLED's active-area 52C had six quantum well cladding-layers 50A, 50B, 50C, 50D, 50E, 50F (FIG. 22B) comprised from ternary (GaAlAs) "Gallium-Aluminum-Arsenide" semiconductor material the before mentioned six quantum well cladding-layers would each need to have a material thickness of about "21.30" nanometers. The thickness amounts for each of the seven quantum well layers and six quantum well cladding-layers located within the alternative FCLED's active-area 52C, when combined, should have a total material thickness equaling "200" nanometers or one-quarter of one wavelength of the fundamental "800" nanometer light that is created by the alternative FCLED's active-region 52 (FIG. 23).

In addition, the alternative embodiment of the present FCLED invention has its general energy profile diagrammatically characterized in FIG. 21. More specifically, FIG. 21 illustrates the profile of the potential wells and the discreet energy levels assumed by the carriers respectively in the conduction and valency bands (i.e., respectively electrons and holes) that generally occur within the alternative embodiment. When, an epitaxy, semiconductor film with a small forbidden band e2 (e.g., film with a typical thickness of about ten nanometers), such as films 49A, 49B, 49C, 49D, 49E, 49F, 49G (FIG. 22B), which are surrounded by two films with a larger forbidden band e0 (e.g., film with a typical thickness of about twenty nanometers), such as films 50A, 50B, 50C, 50D, 50E, 50F (FIG. 22B), the previously mentioned electrons and holes of the small forbidden band material 49A, 49B, 49C, 49D, 49E, 49F, 49G (FIG. 22B), are confined in monodirectional potential wells e2. Moreover, as illustrated in FIG. 21, the movement of an electron into a well created in the conduction band of height .DELTA.E.sub.c is quantified in discreet states of energy E.sub.1, E.sub.2, E.sub.3, etc.; moreover, in the same way, the movement of a hole into a well created in the valency band of height .DELTA.E.sub.x is quantified in discreet states of energy E'.sub.1, E'.sub.2, and E'.sub.3. When the thickness of the small forbidden bandwidth material e2 varies, the energy states assumed by the carriers will also vary. Therefore, the emission length of the previously mentioned MQW structures can consequently be adjusted by the choice, the nature, and the thickness of the semiconductor material films used in their construction.

In addition, the alternative embodiment to the present FCLED invention, as illustrated in FIG. 23, shows that next layer in line for deposition is a second "100" nanometers thick non-graded SCH cladding-layer 52D, which is comprised from a p-doped (GaAlAs) "Gallium-Aluminum-Arsenide" ternary semiconductor material that is deposited using MBE or MOCVD onto the top and outermost surface of the alternative FCLED diode's active-area 52C (FIG. 23). Giving it a deposited position between the alternative FCLED diode's active-area 52C and the alternative FCLED diode's second primary non-graded confinement cladding-layer 52E (FIG. 23). An alternative FCLED diode's second "100" nanometers thick non-graded SCH cladding-layer 52D is to be made from a material having an refractive index between the refractive index of the alternative FCLED diode's multiple quantum wells and the refractive index of the material used to construct the alternative FCLED diode's second primary non-graded confinement cladding layers 52E (FIG. 23).

In addition, the alternative embodiment to the present FCLED invention as illustrated in FIG. 23 shows that the next layer in line for deposition is an alternative FCLED diode's second "200" nanometers thick primary non-graded confinement cladding-layer 52E, which is epitaxially deposited using MBE or MOCVD onto the top and outermost surface of the alternative FCLED diode's second "100" nanometers thick non-graded SCH cladding-layer 52D (FIG. 23). Giving it a deposited position between the alternative FCLED diode's second "100" nanometers thick non-graded SCH cladding-layer 52D and the alternative FCLED diode's second contact-layer 53 (FIG. 23). The alternative embodiment of the present FCLED invention as illustrated in FIG. 23 shows that the second "200" nanometers thick primary non-graded confinement cladding-layer 52E (FIG. 23) is comprised from a P-doped (AlGaAs) "Aluminum-Gallium-Arsenide" ternary semiconductor material.

In addition, the alternative embodiment to the present FCLED invention as illustrated in FIG. 23 shows the next layer in line for deposition is an alternative FCLED diode's second "200" nanometers thick contact-layer 53, which is comprised from a highly+p-doped (GaAs) "Gallium-Arsenide" binary semiconductor material that is epitaxially deposited onto the top and outermost surface of the alternative FCLED diode's second primary non-graded confinement cladding-layer 52E (FIG. 23). The alternative embodiment to the present FCLED invention as illustrated in FIG. 23 shows that the second "200" nanometers thick contact-layer 53 (FIG. 23), while providing positive electrical connectivity to the alternative FCLED diode's active-region 52 (FIG. 23), will also enhance the reliability of the alternative FCLED diode's design by preventing the migration of carrier-dislocations, and the like, to the alternative FCLED diode's active-area 52C (FIG. 23).

Furthermore, the alternative embodiment to the present FCLED invention as illustrated in FIG. 23 shows a standing wave 54 (FIG. 23) plotted across the alternative embodiment double-heterostructure diode's structure. Wherein, the standing wave's 54 peak crest is centered onto the center of the alternative FCLED diode's active-area 52C (FIG. 23), which illustrates how a standing wave should propagate through a properly designed active-region. For example, an alternative FCLED diode's active-region, as illustrated in FIG. 23, shows that when the diode device comprises two contra-propagating "100" nanometers thick non-graded SCH cladding-layers 52B, 52D and an active-area "200" nanometers thick 52C (FIG. 23) layers, moreover equaling a total material thickness of "400" nanometers or one-half of one wavelength of the fundamental "800" nanometer light generated by the alternative embodiment diode's active-region, would be centered on a propagating standing wave's crest; thus generating the optimal gain that will generate greater stimulated emissions of intra-cavity produced light.

Advantages

From the description above, a number of advantages of my present invention become evident:

(a) The total elimination, along with the manufacturing processes associated with their construction, of what is typically known in prior-art SLLED design as quarter-wave mirror stack assemblies, or base located quarter-wave mirror stack reflectors, which are replaced as illustrated in FIGS. 11, 12, 13, 14, 15, 16, and 17 by the present inventions polyhedral prism waveguide 34, 42, 45 (FIGS. 18A, 18B, 19A, 19B, 20A, and 20B).

(b) The use of a polyhedral prism waveguide, which is located at the base of the present invention's vertical cavity, replaces the more conventional metallic alloy and/or sapphire substrates and/or the planar-flat multilayered quarterwave mirror stack assemblies 16, 24 (FIGS. 1, 2, 3, 4, 5, 6, 7, 8, 9, and 10) normally used in prior-art SLLED designs, with a single layered monolithic structure that will transmit any or all frequencies of optical radiation produced by the FCLED diode.

(c) The polyhedral prism waveguides used in the present invention are monostructural (i.e., formed into a single shape from a single material) polyhedrons, which are geometrically complex, but structurally simply, as opposed to the quarterwave mirror stacks used in prior-art SLLEDs, which are geometrically simple, but structurally complex, and comprised as multilayered structures having a multitude of thin-film planar-flat plates that are constructed from materials having alternate refractive indices.

(d) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" are inexpensive and easy to manufacture.

(e) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" are moisture resistant.

(f) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" are heat resistant.

(h) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" are non-conducting.

(j) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" are non-polarizing to intra-cavity produced light.

(k) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" are amorphous (i.e., a material made up of molecules that lack a distinct crystalline structure) and, therefore have an absolute lattice-mismatch to typical diode constructing semiconductor materials like (GaAs) "Gallium-Arsenide" and (AlGaAs) "Aluminum-Gallium-Arsenide, and to other Zinc-blend semiconductor materials, as well. This tends to promote greater reflectivity at the material interface located between the FCLED's first contact layer 35 (FIGS. 13 and 14) and the FCLED's polyhedral prism waveguide.

(l) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" are optically transparent to optical radiation having wavelengths ranging from the very-short "150" nanometers of ultraviolet radiation to the very-long "5000" nanometers of infrared radiation.

(m) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" will optically transmit optical radiation having wavelengths ranging from the very-short "150" nanometers of ultraviolet radiation to the very-long "5000" nanometers of infrared radiation.

(n) The present invention's monostructural polyhedral prism waveguides 34, 42, 45 (FIGS. 18A, 18B, 19A, 19B, 20A, and 20B), when constructed from Quartz or (SiO2) "Fused Silicon-Dioxide" are totally and internally reflecting to optical radiation having wavelengths ranging from the very-short "150" nanometers of ultraviolet radiation to the very-long "5000" nanometers of infrared radiation.

(o) The present invention's monostructural polyhedral prism waveguides 34, 42, 45 (FIGS. 18A, 18B, 19A, 19B, 20A, and 20B) have a monostructural geometry that gives them the ability to internally redirect a "180" degrees all optical radiation that enters their plane-parallel, flat-horizontal, and circular top front-face surface 34D (FIGS. 18A and 18B), 42C (FIGS. 19A and 19B), 45B (FIGS. 20A and 20B).

(p) The present invention's monostructural polyhedral prism waveguides 34, 42, 45 (FIGS. 18A, 18B, 19A, 19B, 20A, and 20B) will increase the present inventions spectral linewidth and output gain by extending its optical-cavity length.

Operation—FIGS. 11, 12, 13, 14, 15, 21, 22A, 22B, and 23

There are relative possibilities with regard to the present invention's choice of light emitting active-regions, one of which is the FCLED's novel approach to a double-heterostructure semiconductor LED design 36 (FIGS. 13 and 14), which is based upon the structural enhancement of its cladding-layers, which effectively increase the amount of recombined "electron/hole" radiation, or what is generally called "radiative recombination" occurring within the FCLED's active-region 36B (FIGS. 13 and 14).

Furthermore, the present FCLED invention as illustrated in FIGS. 13 and 14 effectively displays a sectional view of the FCLED's many different layers of semiconductor and optical materials that are used in the FCLED's construction. Wherein, the previously mentioned layers, which are used to construct a FCLED's double-heterostructure LED active-region, a FCLED's polyhedral prism waveguide, and a FCLED's light collimating and focusing window emitter-layer are built-up, layer upon layer, using various epitaxial and sputtered processes of material deposition. For example, the multilayers of optical and semiconductor materials that make up a FCLED device are typically constructed using widely excepted methods of material deposition like MBE, MOCVD, and/or epitaxial ion-sputtering.

The present FCLED invention, as illustrated in FIGS. 11, 12, 13, 14, 15, 21, 22A, 22B, and 23 is an index-guided super-luminescent semiconductor light emitting diode, which has totally eliminated substrate positioned multilayered quarterwave mirror stack base-reflector assemblies typical of prior-art SLLED design 16, 24 (FIGS. 1, 2, 3, 4, 5, 6, and 7) and replaced them with a single layered polyhedral shaped waveguide structure 34, 42, 45 (FIGS. 18A, 18B, 19A, 19B, 20A, and 20B). However, regardless of any changes that might be made to an index-guided super-luminescent semiconductor light emitting diode's optical cavity, light amplifying processes via stimulated-emission can only occur within an index-guided super-luminescent semiconductor light emitting diode, if a significant amount of fundamental light-waves produced by the diode's active-region 36 (FIGS. 13 and 14), 52 (FIG. 23) are made to travel through the diode's active-region by way of reflection using a single light reflecting structure, in the present inventions case a waveguide 34, 42, 45 (FIGS. 18A, 18B, 19A, 19B, 20A, and 20B).

Moreover, the present FCLED invention as illustrated in FIGS. 11, 12, 13, 14, 15, 21, 22A, 22B, and 23 will amplify light, via stimulated-emission, when light-waves produced by the diode's active-region 36 (FIGS. 13 and 14) are made to travel through the previously mentioned active-region 36 and the multiple quantum well structures that make-up the active-region's active-area 36B (FIGS. 13 and 14), using a single light reflecting structure 34, 42, 45 to redirect intra-cavity produced light through the diode's active-region and out of the diode's window emitter-layer. However, in the present FCLED invention the previously mentioned light-waves do not travel between one mirror and one window layer, which are located at opposite ends of an optical cavity's active-region 24, 32, as illustrated in FIGS. 5, 6, and 7, but travel between one polyhedral prism waveguide 34 (FIGS. 13 and 14) and one window emitter-layer that are also located at opposite ends of an optical cavity's active-region 34, 38, as illustrated in FIGS. 11, 12, 13, and 14, as output emissions.

For example, the present FCLED invention, by replacing a substrate 22 (FIG. 7) positioned total refraction-reflecting quarterwave mirror stack assembly 24 (FIG. 7) with a single total internal-reflecting polyhedral prism waveguide 34 (FIG. 13), the optical cavity of the FCLED is folded backwards a "180" degrees upon itself, where light-waves of fundamental light created by the FCLED's active-region 36 (FIG. 13) are made to travel upward, using a folded optical cavity, through the active-region's active-area 36B (FIG. 13), then outward through the diode's window emitter-layer 38 (FIG. 13). The redirected light-waves that occur within a FCLED's folded optical cavity, while propagating through the FCLED's polyhedral shaped prism waveguide 34 (FIG. 13), will have angles of incidence that are equal to or greater than the critical angle of internal reflection for the polyhedral prism waveguide's prism facets 34A, 34B, 34C, which are located at the base of every FCLED polyhedral prism waveguide 34, 42, 45 (FIGS. 18A, 18B, 19A, 19B, 20A, and 20B).

Moreover, the light-waves 40A (FIGS. 18A and 18B) that propagate 40B in a direction away from the FCLED's active-region 36 (FIG. 13) into the FCLED's polyhedral prism waveguide 34 (FIGS. 13 and 14) are ultimately turned and redirected by a prism facet 34A (FIGS. 18A and 18B) of the polyhedral prism waveguide 34 (FIGS. 18A and 18B) into a transverse horizontal direction 40C (FIGS. 18A and 18B), until they are turned and redirected again by a second prism facet 34B (FIGS. 18A and 18B), and then turned back into a longitudinal vertical direction 40E (FIGS. 18A and 18B) toward the FCLED's active-region 36 (FIG. 13) by a third prism facet 34C (FIGS. 18A and 18B); wherein, light-waves 40F (FIGS. 18A and 18B) propagating toward the FCLED's emitter-layer 38 (FIG. 13) will stimulate further emission of light as they pass through the active-region's active-area 36B (FIG. 13), until they reach the FCLED's emitter-layer 38, where they 40F will collimate and focus into super-luminescent spectrally-wide light emissions. Thus, creating an optical cavity, which is folded backward onto itself and capable of the amplification of fundamental diode intra-cavity produced light, via the process of stimulated-emission.

Furthermore, a FCLED's polyhedral prism waveguide 34, 42, 45 (FIGS. 18A, 18B, 19A, 19B, 20A, and 20B) as illustrated in FIGS. 11, 12, 13, 14, 15, 16, and 17 are constructed as monolithic polyhedral shaped devices that are conducive to the total internal reflection of intracavity produced optical radiation using an optical material that has an absolute lattice mismatch to other semiconductor materials that could be used in the construction of the FCLED's remaining semiconductor layers. Within the FCLED design, the previously mentioned monolithic polyhedral shaped device is an internal reflecting polyhedral prism waveguide 34, 42, 45 (FIGS. 18A, 18B, 19A, 19B, 20A, and 20B), which redirects any optical radiation that enters its top plane-parallel and flat horizontal front-face surface 34D, 42C, 45B (FIGS. 18A, 18B, 19A, 19B, 20A, and 20B), backwards, toward the FCLED's emitter-layer 38 (FIG. 13).

Moreover, a FCLED's polyhedral prism waveguide 34, 42, 45 (FIGS. 18A, 18B, 19A, 19B, 20A, and 20B), as illustrated in FIGS. 11, 12, 13, 14, 15, 16, and 17, while constructed from (SiO2) "Fused Silicon-Dioxide" or some other suitable frequency specific material, will allow the FCLED's polyhedral prism waveguide to internally redirect and transmit all optical radiation that is incidental upon its top plane-parallel and flat horizontal front-face surface. While, depending upon the optical material used to construct a FCLED's polyhedral prism waveguide 34, 42, 45 the waveguide will have the capability of transmitting optical radiation having wavelengths that range from the ultraviolet (i.e., having a wavelength of "105" nanometers) to the far infrared (i.e., having a wavelength of "10,000" nanometers).

Moreover, extracting light from an LED is not easy because of the high index of refraction of the semiconductor material, which may be in the range of from about 2.9 to 4.0, depending on wavelength and material. According to Snell's law $\sin\theta_c = n_s/n_p$ only rays that impinge on the FCLED's polyhedral prism waveguide's prism facets at an angle equal to or less than $\theta_c$ will be refracted through the surface. All rays impinging at angles greater than $\theta_c$ will experience total internal reflection.

Conclusion, Ramifications, and Scope

Although the FCLED invention has been described in detail with references to specific embodiments, various modifications can be made without departing from the scope of the invention. For example, in order to increase the diode's energy, while decreasing the diode's wavelength per photon of emitted light, active-regions 36 (FIG. 14), 52 (FIG. 23) could contain "Phosphorus" in an amount that will form a lattice-matched quaternary (InGaAsP) "Indium-Gallium-Arsenic-Phosphide" material. Demonstrating, that the choice between one semiconductor and optical material over another for constructing a FCLED device is frequency determined, rather than structurally determined. While, the various semiconductor and optical materials along with their distribution sizes are frequency specific and interchangeable within this design; moreover, indicating that the FCLED design has a novelty that is independent of any one material, or any one material's size, which could or might be used in a FCLED's construction.

What I claim my invention is:

1. A super-luminescent folded cavity light emitting diode, comprising:
   a) a cavity folding waveguide comprising at least one prism facet for reflecting photonic radiation incident upon the cavity folding waveguide 180 degrees;
   a semiconductor diode active-region adjacent to the cavity folding waveguide for producing spontaneous-emission of said photonic radiation;
   a window-emitter adjacent to the semiconductor diode active region such that the semiconductor diode active region is between the cavity folding waveguide and the window-emitter, wherein the window-emitter is for collimating and focusing said photonic radiation.

2. The super-luminescent folded cavity light emitting diode of claim 1, wherein the cavity folding waveguide includes fused silica.

3. The super-luminescent folded cavity light emitting diode of claim 1, wherein the cavity folding waveguide includes a corner cube polyhedral prism waveguide.

4. The super-luminescent folded cavity light emitting diode of claim 3, wherein the corner cube polyhedral prism waveguide includes at least two prism facets.

5. The super-luminescent folded cavity light emitting diode of claim 4, wherein the corner cube polyhedral prism waveguide includes three prism facets.

6. The super-luminescent folded cavity light emitting diode of claim 1, wherein the cavity folding waveguide includes a conical face.

7. The super-luminescent folded cavity light emitting diode of claim 1, wherein the semiconductor diode active region includes:
   a first graded confinement layer adjacent to the cavity folding waveguide;
   an active area; and
   a second graded confinement layer, wherein the second graded confinement layer is adjacent the window-emitter such that the active area is between the first and second graded confinement layers.

8. The super-luminescent folded cavity light emitting diode of claim 7, wherein the active area includes a multi-quantum well.

9. The super-luminescent folded cavity light emitting diode of claim 8, wherein:
   the first graded confinement layer includes an upper surface and a lower surface, wherein the upper surface is adjacent the active area and the lower surface is adjacent the cavity folding waveguide, and wherein the first graded confinement layer includes Galium-Aluminum-Arsenide, wherein the concentration of Gallium increases from the lower surface to the upper surface and the concentration of Aluminum decreases from the lower surface to the upper surface; and
   the second graded confinement layer includes an upper surface end a lower surface, wherein the upper surface is adjacent the window-emitter and the lower surface is adjacent the active area, and wherein the second graded confinement layer includes Gallium-Aluminum-Arsenide, wherein the concentration of Gallium increases from the upper surface to the lower surface and the concentration of Aluminum decreases from the upper surface to the lower surface.

10. The super-luminescent folded cavity light emitting diode of claim 1, wherein the cavity folding waveguide is further for laterally shifting photonic radiation incident upon the cavity folding waveguide.

11. The super-luminescent folded cavity light emitting diode of claim 1, further comprising an optical cladding layer around the cavity folding waveguide and the semiconductor diode active region.

12. The super-luminescent folded cavity light emitting diode of claim 11, wherein the optical cladding layer includes lithium fluoride.

\* \* \* \* \*